United States Patent
Jiang

(10) Patent No.: US 10,756,084 B2
(45) Date of Patent: Aug. 25, 2020

(54) GROUP-III NITRIDE SEMICONDUCTOR DEVICE AND METHOD FOR FABRICATING THE SAME

(71) Applicant: Wen-Jang Jiang, Hsinchu (TW)

(72) Inventor: Wen-Jang Jiang, Hsinchu (TW)

(*) Notice: Subject to any disclaimer, the term of this patent is extended or adjusted under 35 U.S.C. 154(b) by 118 days.

(21) Appl. No.: 15/612,292

(22) Filed: Jun. 2, 2017

(65) Prior Publication Data

US 2017/0271327 A1    Sep. 21, 2017

Related U.S. Application Data

(63) Continuation-in-part of application No. 15/079,227, filed on Mar. 24, 2016, now Pat. No. 9,722,042.

(30) Foreign Application Priority Data

Mar. 26, 2015 (TW) .............................. 104109854 A

(51) Int. Cl.
*H01L 29/778* (2006.01)
*H01L 29/872* (2006.01)
(Continued)

(52) U.S. Cl.
CPC ...... *H01L 27/0629* (2013.01); *H01L 21/8236* (2013.01); *H01L 21/8252* (2013.01);
(Continued)

(58) Field of Classification Search
CPC ............. H01L 27/0629; H01L 23/3185; H01L 29/513; H01L 29/205; H01L 29/868;
(Continued)

(56) References Cited

U.S. PATENT DOCUMENTS 5,023,675 A * 6/1991 Ishikawa ........... H01L 21/30621
                                                        257/194
5,705,847 A * 1/1998 Kashiwa ............. H01L 21/8252
                                                        257/471
(Continued)

FOREIGN PATENT DOCUMENTS

JP    2012-199285    * 10/2012    ........... H01L 27/095
TW       457555 B      10/2001

OTHER PUBLICATIONS

Control of Threshold Voltage of AlGaN/GaN HEMTs by Fluoride-Based Plasma Treatment: From Depletion Mode to Enhancement Mode, Yong Cai, et al., IEEE Transactions on Electron Devices. vol. 53, No. 9, Sep. 2006.

(Continued)

*Primary Examiner* — Mary A Wilczewski
(74) *Attorney, Agent, or Firm* — Rosenberg, Klein & Lee

(57) ABSTRACT

The present invention discloses a group-III nitride semiconductor device, which comprises a substrate, a buffer layer, a semiconductor stack structure, and a passivation film. The buffer layer is disposed on the substrate. The semiconductor stack structure is disposed on the buffer layer and comprises a gate, a source, and a drain. In addition, a gate insulating layer is disposed between the gate and the semiconductor stack structure for forming a HEMT. The passivation film covers the HEMT and includes a plurality of openings corresponding to the gate, the source, and the drain, respectively. The material of the passivation film is silicon oxynitride.

7 Claims, 28 Drawing Sheets

(51) Int. Cl.

| | |
|---|---|
| *H01L 21/8236* | (2006.01) |
| *H01L 27/06* | (2006.01) |
| *H01L 29/20* | (2006.01) |
| *H01L 23/31* | (2006.01) |
| *H01L 23/29* | (2006.01) |
| *H01L 29/66* | (2006.01) |
| *H01L 27/088* | (2006.01) |
| *H01L 21/8252* | (2006.01) |
| *H01L 27/02* | (2006.01) |
| *H01L 29/205* | (2006.01) |
| *H01L 29/868* | (2006.01) |
| *H01L 29/51* | (2006.01) |
| *H01L 29/207* | (2006.01) |

(52) U.S. Cl.
CPC ........ *H01L 23/291* (2013.01); *H01L 23/3171* (2013.01); *H01L 23/3185* (2013.01); *H01L 27/0255* (2013.01); *H01L 27/0605* (2013.01); *H01L 27/0883* (2013.01); *H01L 29/2003* (2013.01); *H01L 29/205* (2013.01); *H01L 29/513* (2013.01); *H01L 29/66212* (2013.01); *H01L 29/66462* (2013.01); *H01L 29/7786* (2013.01); *H01L 29/7787* (2013.01); *H01L 29/868* (2013.01); *H01L 29/872* (2013.01); *H01L 29/207* (2013.01)

(58) Field of Classification Search
CPC ............ H01L 29/7786; H01L 29/2003; H01L 29/872; H01L 29/66212; H01L 21/8236; H01L 29/7787; H01L 23/3171; H01L 27/0605; H01L 21/08; H01L 27/0255; H01L 27/0883; H01L 29/66462; H01L 23/291; H01L 21/8252
See application file for complete search history.

(56) References Cited

U.S. PATENT DOCUMENTS

| | | | |
|---|---|---|---|
| 7,375,407 B2 | 5/2008 | Yanagihara et al. | |
| 7,525,122 B2* | 4/2009 | Ring | H01L 21/045 257/76 |
| 7,825,435 B2* | 11/2010 | Machida | H01L 25/18 257/195 |
| 7,952,150 B1* | 5/2011 | Wohlmuth | H01L 21/28264 257/392 |
| 7,972,915 B2 | 7/2011 | Chen et al. | |
| 8,076,699 B2* | 12/2011 | Chen | H01L 27/0605 257/194 |
| 8,723,222 B2 | 5/2014 | Bae et al. | |
| 8,946,779 B2 | 2/2015 | Green et al. | |
| 9,220,135 B2* | 12/2015 | Huang | H01L 27/15 |
| 9,661,698 B2* | 5/2017 | Huang | H01L 27/15 |
| 9,666,580 B1* | 5/2017 | Nagasato | H01L 27/0629 |
| 9,722,042 B2* | 8/2017 | Jiang | H01L 29/66462 |
| 9,954,003 B2* | 4/2018 | Matsuda | H01L 27/1222 |
| 9,960,154 B2* | 5/2018 | Kinzer | H01L 27/0605 |
| 2006/0081897 A1* | 4/2006 | Yoshida | H01L 21/8252 257/289 |
| 2007/0228416 A1 | 10/2007 | Chen et al. | |
| 2008/0121876 A1* | 5/2008 | Otsuka | H01L 23/293 257/40 |
| 2008/0191216 A1* | 8/2008 | Machida | H01L 25/18 257/76 |
| 2008/0212895 A1* | 9/2008 | Mattox | H04N 9/045 382/294 |
| 2009/0065810 A1* | 3/2009 | Honea | H01L 27/0605 257/192 |
| 2009/0267078 A1 | 10/2009 | Mishra et al. | |
| 2009/0278236 A1* | 11/2009 | Sato | H01L 21/6836 257/620 |
| 2010/0019279 A1* | 1/2010 | Chen | H01L 27/0605 257/194 |
| 2010/0078683 A1* | 4/2010 | Baba | H01L 29/2003 257/192 |
| 2010/0084687 A1* | 4/2010 | Chen | H01L 29/207 257/194 |
| 2010/0140660 A1* | 6/2010 | Wu | H01L 29/2003 257/183 |
| 2011/0018002 A1* | 1/2011 | Chen | H01L 21/28575 257/76 |
| 2011/0088456 A1* | 4/2011 | Ren | G01N 33/005 73/31.06 |
| 2011/0204381 A1* | 8/2011 | Okada | H01L 21/8252 257/76 |
| 2011/0254056 A1* | 10/2011 | Machida | H01L 27/0605 257/195 |
| 2012/0049244 A1* | 3/2012 | Imada | H01L 23/49562 257/194 |
| 2012/0049973 A1* | 3/2012 | Smith, Jr. | H03K 17/693 333/103 |
| 2012/0098038 A1* | 4/2012 | Shono | H01L 27/0605 257/195 |
| 2012/0138948 A1* | 6/2012 | Miyajima | H01L 29/4236 257/76 |
| 2012/0138955 A1* | 6/2012 | Ishiguro | H01L 29/66462 257/77 |
| 2012/0138956 A1* | 6/2012 | Shimizu | H01L 21/02458 257/77 |
| 2012/0205718 A1* | 8/2012 | Shimizu | H01L 29/1075 257/194 |
| 2012/0208351 A1* | 8/2012 | Nakamura | C23C 16/4405 438/478 |
| 2012/0223319 A1* | 9/2012 | Dora | H01L 29/2003 257/76 |
| 2013/0043489 A1* | 2/2013 | Kotani | H01L 21/02381 257/77 |
| 2013/0082307 A1* | 4/2013 | Okamoto | H01L 21/28581 257/279 |
| 2013/0083569 A1* | 4/2013 | Minoura | H01L 29/66462 363/37 |
| 2013/0087803 A1* | 4/2013 | Kizilyalli | H01L 29/66462 257/76 |
| 2013/0193487 A1* | 8/2013 | Peroni | H01L 29/402 257/194 |
| 2013/0240893 A1* | 9/2013 | Bedell | H01L 27/088 257/76 |
| 2013/0240897 A1* | 9/2013 | Imada | H01L 29/778 257/76 |
| 2013/0292790 A1* | 11/2013 | Minoura | H01L 27/0814 257/471 |
| 2014/0048850 A1* | 2/2014 | Jeon | H01L 27/0605 257/195 |
| 2014/0138700 A1* | 5/2014 | Seok | H01L 29/475 257/76 |
| 2014/0284655 A1* | 9/2014 | Ikeda | H01L 27/0266 257/139 |
| 2014/0353673 A1* | 12/2014 | Ito | H01L 29/2003 257/76 |
| 2014/0367700 A1* | 12/2014 | Prechtl | H01L 21/8234 257/77 |
| 2014/0375372 A1* | 12/2014 | Ikeda | H01L 25/18 327/333 |
| 2015/0028391 A1* | 1/2015 | Takahashi | H01L 29/205 257/195 |
| 2015/0262997 A1* | 9/2015 | Sato | H01L 27/0629 257/76 |
| 2015/0295051 A1* | 10/2015 | Donkers | H01L 29/205 257/76 |
| 2015/0371987 A1* | 12/2015 | Pan | H01L 27/0248 257/76 |
| 2016/0035719 A1* | 2/2016 | Kanechika | H01L 29/66462 257/195 |
| 2016/0086938 A1* | 3/2016 | Kinzer | H01L 27/0605 257/76 |
| 2016/0284815 A1* | 9/2016 | Jiang | H01L 29/66462 |
| 2016/0293597 A1* | 10/2016 | Curatola | H01L 29/7786 |

(56) References Cited

U.S. PATENT DOCUMENTS

| | | | | |
|---|---|---|---|---|
| 2016/0351564 | A1* | 12/2016 | Azize | H01L 29/66704 |
| 2017/0018617 | A1* | 1/2017 | Xia | H01L 29/404 |
| 2017/0271327 | A1* | 9/2017 | Jiang | H01L 21/8236 |
| 2017/0309676 | A1* | 10/2017 | Odnoblyudov | H01L 27/15 |
| 2017/0358495 | A1* | 12/2017 | Jiang | H01L 21/8252 |
| 2018/0158940 | A1* | 6/2018 | Shibib | H01L 29/42316 |
| 2018/0350944 | A1* | 12/2018 | Huang | H01L 29/66462 |

OTHER PUBLICATIONS

Monolithically Integrated Enhancement/Depletion-Mode AlGaN/GaN HEMTs SRAM Unit and Voltage Level Shifter Using Fluorine Plasma Treatment, Chen Yonghe, et al., vol. 37, No. 5, Journal of Semiconductors, May 2016.

Monolithically Integrated Enhancement/Depletion-Mode AlGaN/GaN Hemt Inverters and Ring Oscillators Using CF4 Plasma Treatment, Yong Cai, et al., IEEE Transactions on Electron Devices, vol. 53, No. 9, Sep. 2006.

Normally-Off Operation AlGaN/GaN MOS-HEMT With High Threshold Voltage, C.-T, Chang, et al., Electronics Letters, Sep. 2, 2010, vol. 46, No. 18.

\* cited by examiner

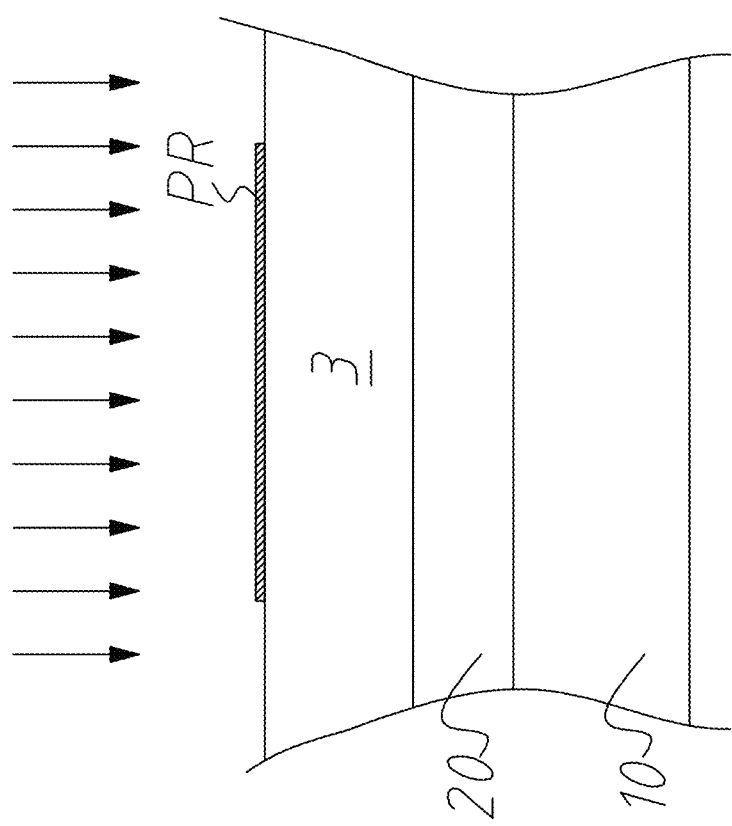

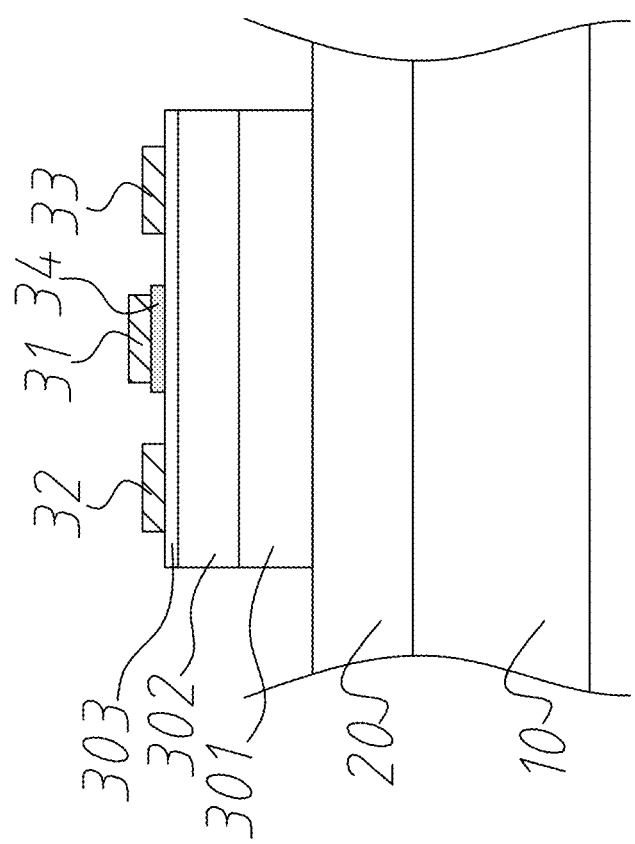

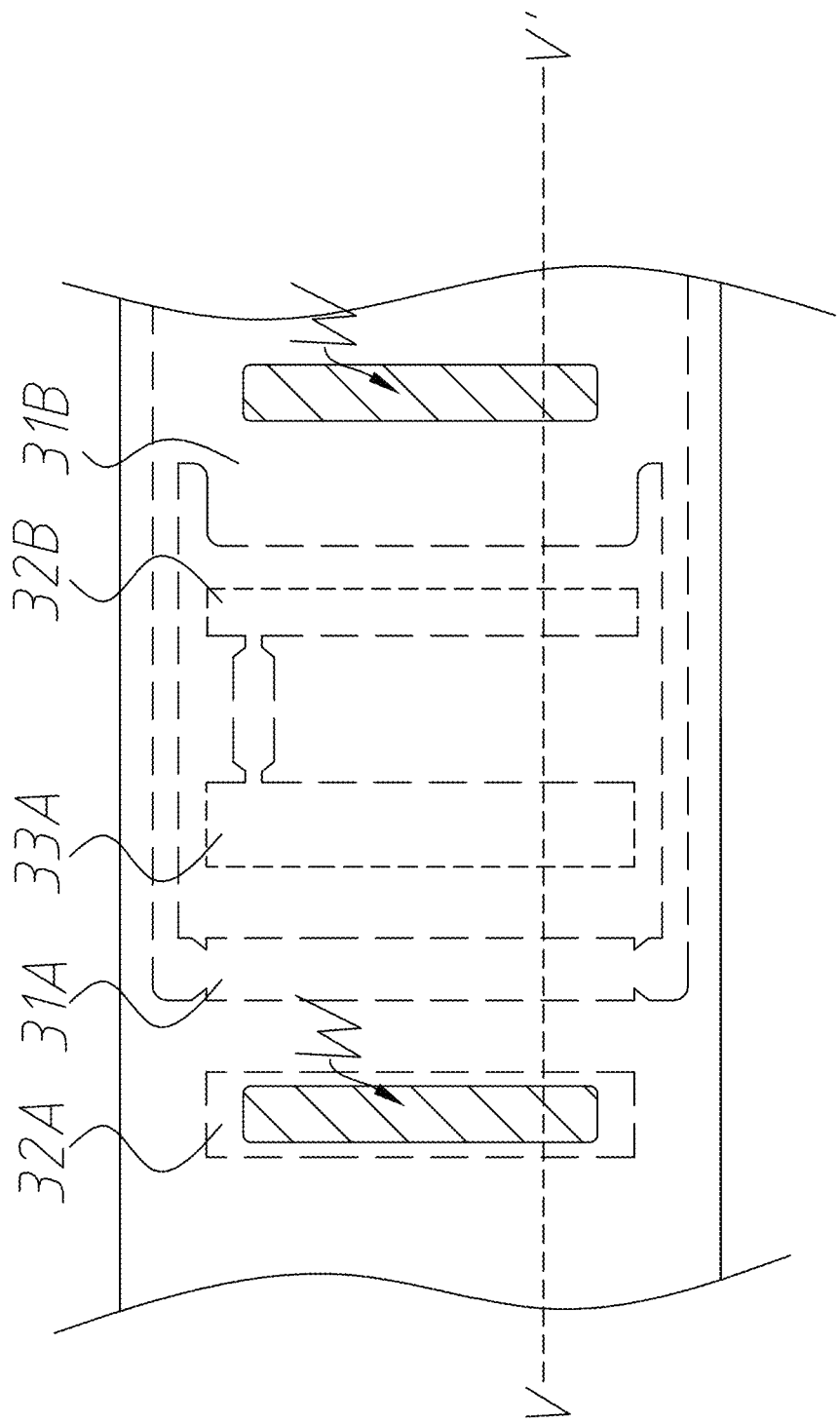

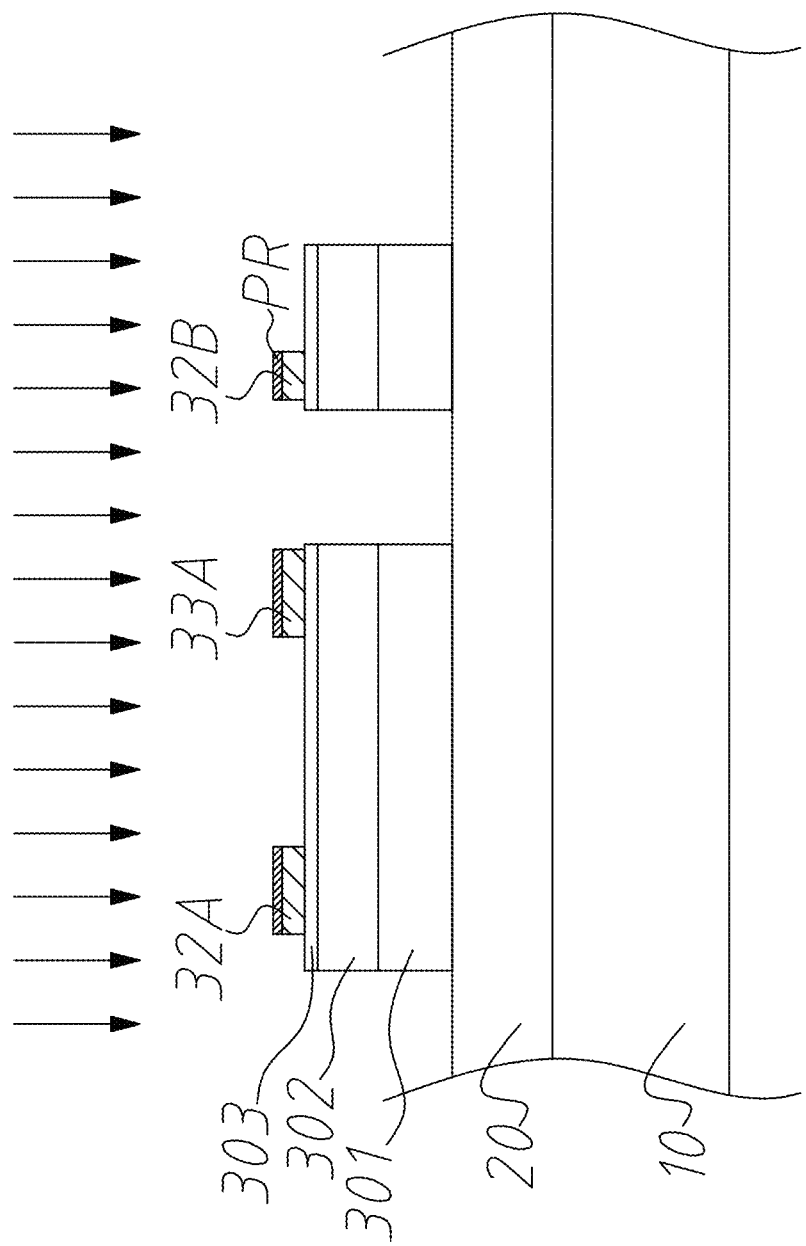

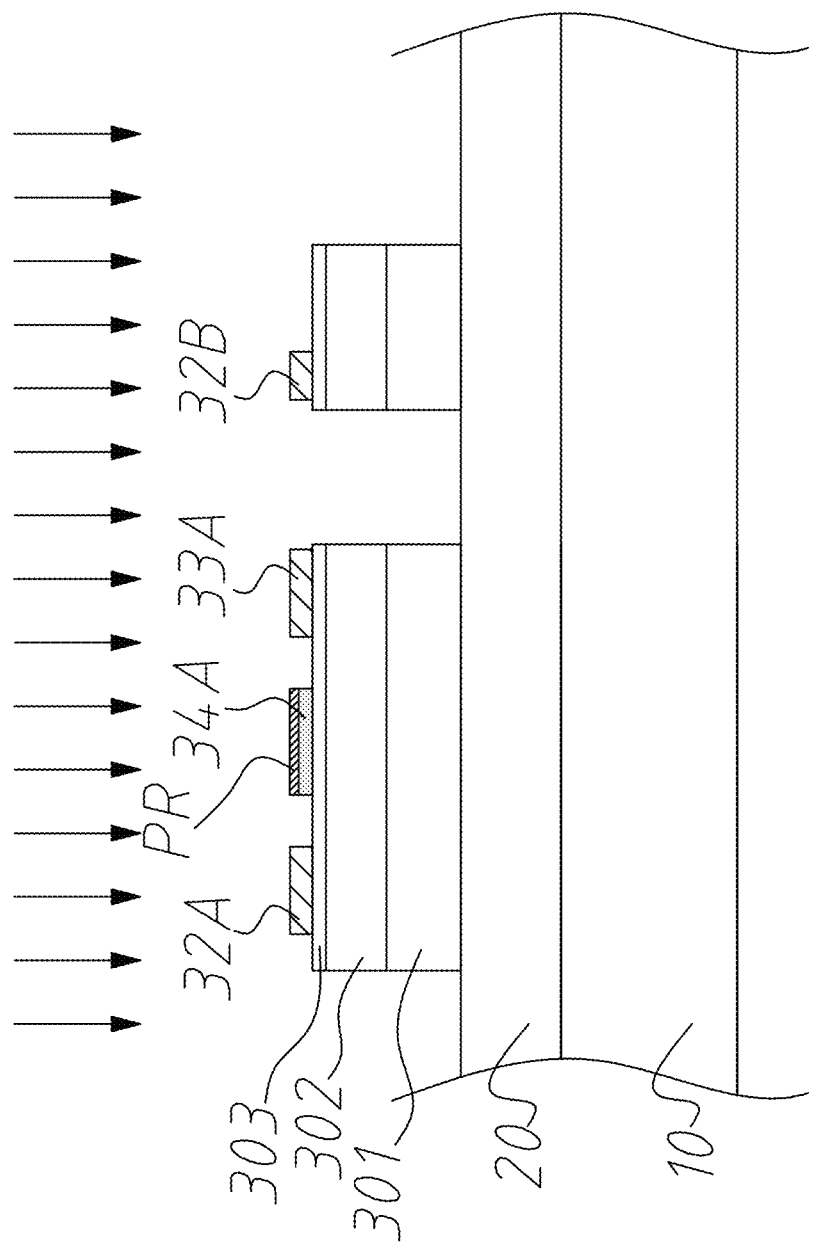

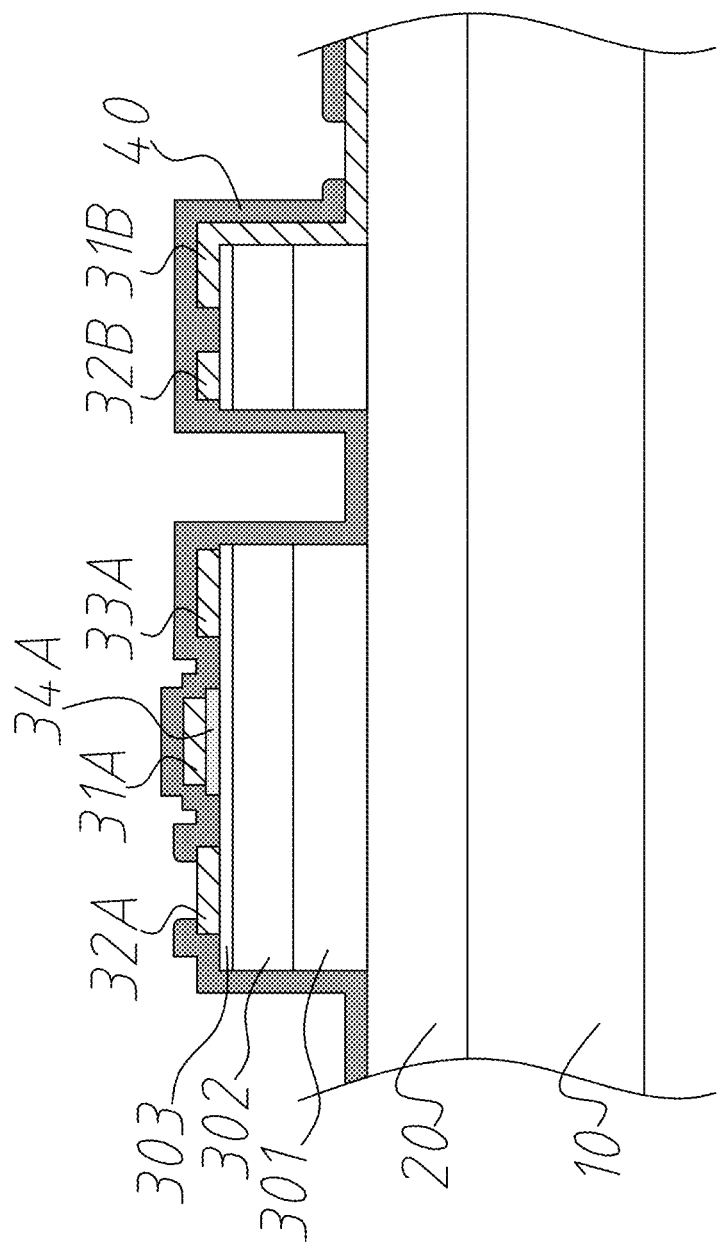

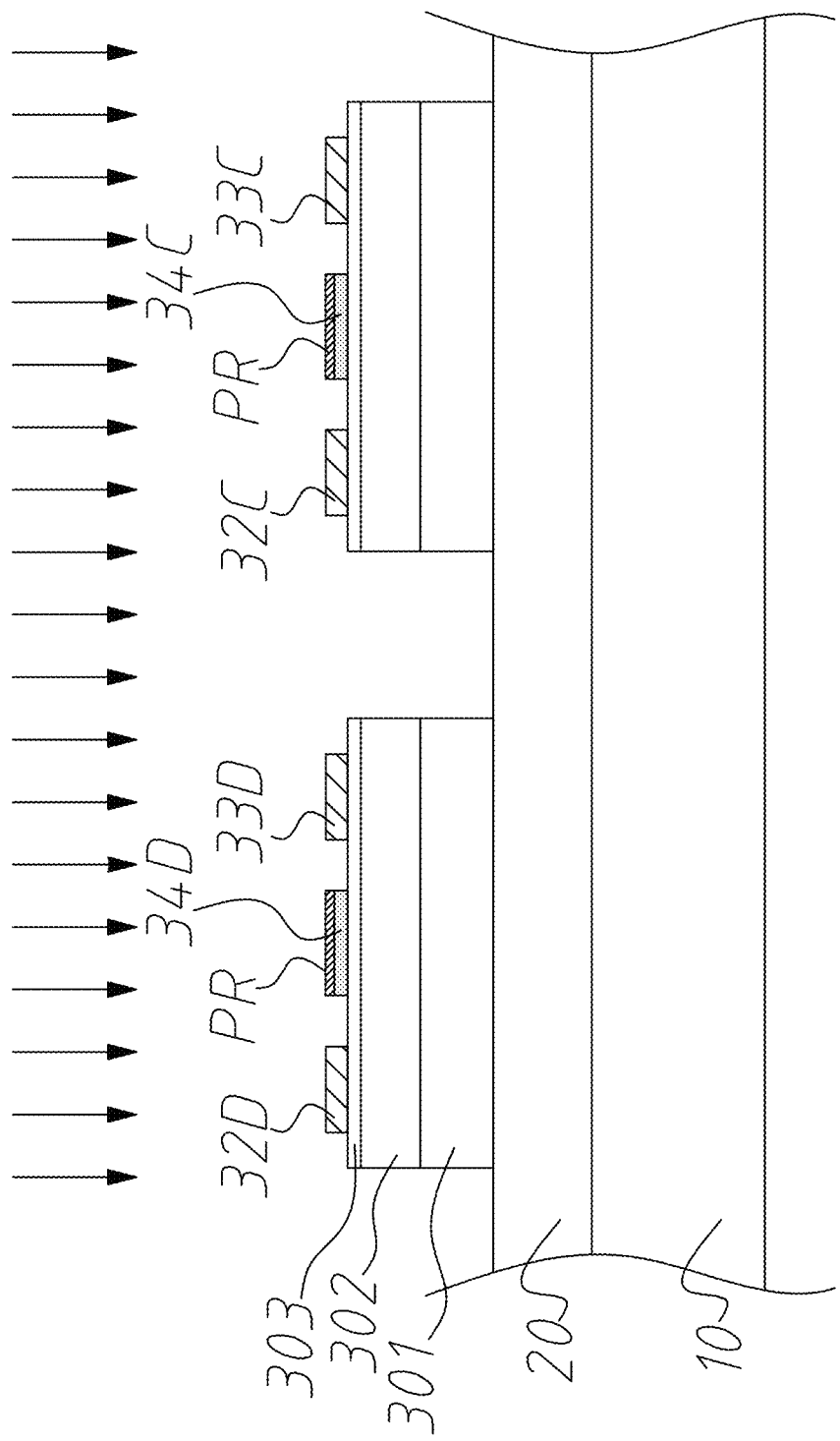

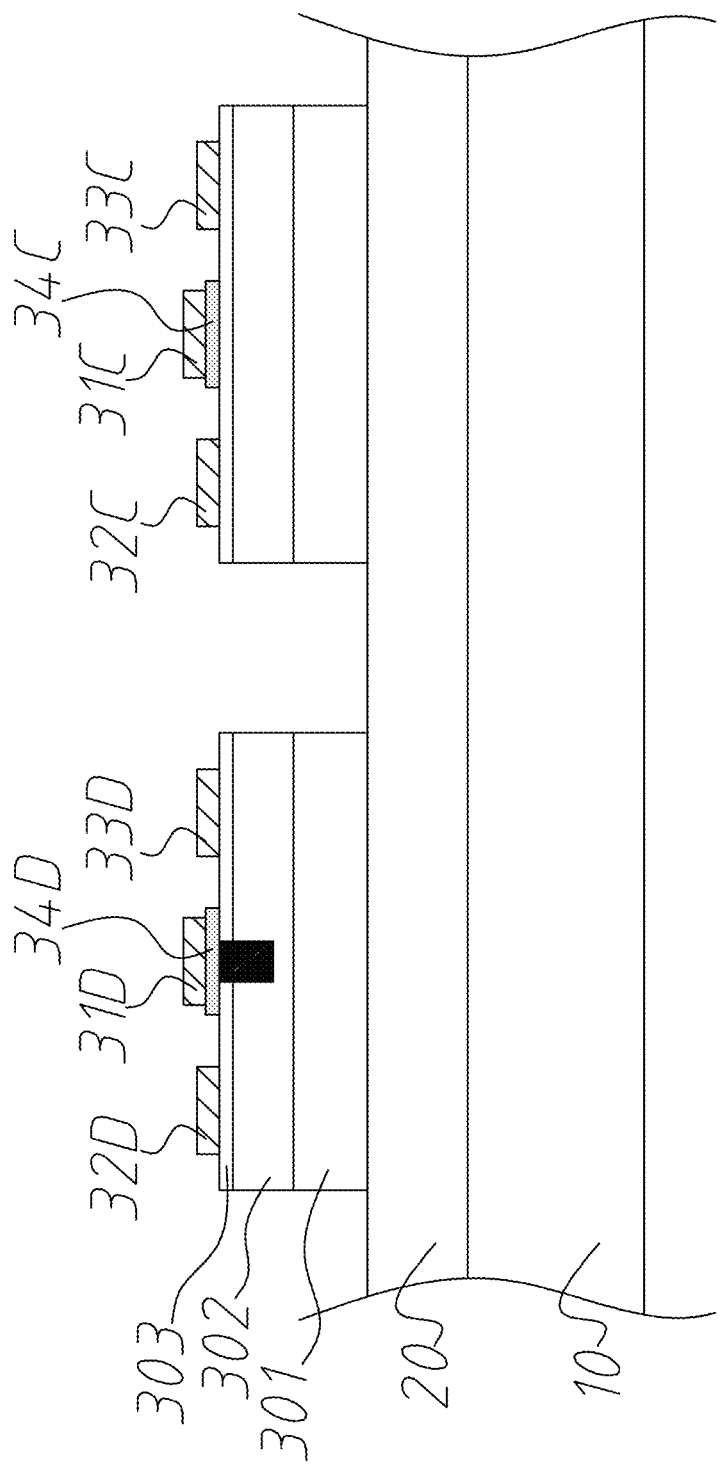

GROUP-III NITRIDE SEMICONDUCTOR DEVICE AND METHOD FOR FABRICATING THE SAME

CROSS-REFERENCE TO RELATED APPLICATION

This Application is being filed as Continuation-In-Part application of Ser. No. 15/079,227, filed on 24 Mar. 2016, currently pending, which claims the benefit of Taiwan Patent Application No. 104109854, filed on 26 Mar. 2015, which is incorporated by reference herein.

FIELD OF THE INVENTION

The present invention relates generally to a high-voltage and low-leakage group-III nitride semiconductor device and the method for fabricating the same.

BACKGROUND OF THE INVENTION

To fabricate a Schottky barrier diode (SBD), the region outside the active regions of the device is first etched to the high-resistivity epitaxy layer before fabricating ohmic contacts on both sides of Schottky contacts, where the Schottky contacts are the anodes and the ohmic contacts are the cathodes. The greatest defect of the design is that the spacing between electrodes determines the forward current and the reverse breakdown voltage. As the spacing is shortened, the forward current is increased whereas the reverse breakdown voltage is lowered. Contrarily, when the spacing is increased, the reverse breakdown voltage is increased whereas the forward current is lowered. Thereby, according to the prior art, trade-offs occur between forward current and reverse breakdown voltage and hence bringing inconvenience for circuit design. In order to overcome the above defect, according to the prior art, the SBD is coupled to a high electron mobility transistor (HEMT). As shown in FIG. 1, in forward bias, the HEMT is turned on; in reverse bias, the HEMT is turned off. By using this method, the SBD is protected from breakdown in reverse biases. Nonetheless, this method requires coupling two independent devices. In circuit design, it requires more area. Besides, in high-speed switching, the overall speed will be lowered, resulting in degradation of device performance.

A HEMT is generally classified into two modes: the depletion mode and the enhancement mode. According to the prior art, the channel of a depletion-mode HEMT is injected with fluorine ions ($F^-$) so that the 2-dimensional electron gas (2DEG) in the injected region is raised above the Fermi energy level and forming an enhancement-mode HEMT. Nonetheless, no matter in which mode, the HEMTs according to the prior art still suffers from the trade-off between current collapse effect and drain to source breakdown voltage. In addition, for an active device, it is considered how to reduce the surface leakage current.

In the past, silicon dioxide ($SiO_2$) is generally adopted as the surface passivation film of a HEMT for increasing it breakdown voltage as well as reducing the surface leakage current. By using the deep traps formed by using $SiO_2$ as the passivation film interface, the electrons are trapped and thus increasing the breakdown voltage. Nonetheless, the deep traps induce the problem of slow current recovery when the drain of the HEMT is given a high voltage bias in off-mode (which by means the drain to gate is given a high voltage reverse bias) is switched to an on-mode (which by means the drain to source is given a high voltage forward bias). According to the prior art, there have been many discussions on reverse recovery current. Nevertheless, there is no publication focused on analysis or discussion of current collapse effect. FIG. 2 shows a schematic diagram of current collapse effect of a GaN SBD. When a device is reversely biased, the current is extremely small and approaches to zero. At this moment, as a forward bias is applied, the current cannot increase as soon as the voltage. It requires a delay time. Thereby, under high-speed operations, the operating speed of the device is reduced.

Accordingly, according to the prior art, there still exist the problems of inability in optimizing the forward current and the reverse breakdown voltage and in optimizing the forward recovery current and the surface leakage current.

SUMMARY

An objective of the present invention is to provide a group-III nitride semiconductor device, which uses its structure property to own high reverse breakdown voltage and high forward current.

Another objective of the present invention is to provide a group-III nitride semiconductor device, which uses its material property to own low surface leakage current and fast forward recovery current.

A further objective of the present invention is to provide a method for fabricating the above device in a single process.

In order to achieve the above objectives and efficacies, the present invention discloses a group-III nitride semiconductor device, which comprises a substrate, a buffer layer, a semiconductor stack structure, and a passivation film. The buffer layer is disposed on the substrate. The semiconductor stack structure is disposed on the buffer layer and comprises a gate, a source, and a drain. In addition, a gate insulating layer is disposed between the gate and the semiconductor stack structure for forming a HEMT. The passivation film covers the HEMT and includes a plurality of openings corresponding to the gate, the source, and the drain, respectively. The material of the passivation film is silicon oxynitride.

According to an embodiment of the present invention, the group-III nitride semiconductor device comprises a substrate, a buffer layer, a first semiconductor stack structure, a second semiconductor stack structure, and a passivation film. The buffer layer is disposed on the substrate. The first semiconductor stack structure is disposed on the buffer layer and comprises a gate, a source, and a drain. In addition, a gate insulating layer is disposed between the gate and the first semiconductor stack structure for forming a HEMT. The second semiconductor stack structure is disposed on the buffer layer and comprises an anode and a cathode for forming a SBD. The anode is connected to the gate and the cathode is connected to the drain. The passivation film covers the HEMT and the SBD, and includes a plurality of openings corresponding to the source and the anode, respectively.

According to an embodiment of the present invention, the group-III nitride semiconductor device comprises a substrate, a buffer layer, a first semiconductor stack structure, a second semiconductor stack structure, and a passivation film. The buffer layer is disposed on the substrate. The first semiconductor stack structure is disposed on the buffer layer and comprises a first gate, a first source, and a first drain. In addition, a first gate insulating layer is disposed between the first gate and the first semiconductor stack structure for forming a first HEMT. The second semiconductor stack structure is disposed on the buffer layer and comprises a second gate, a second source, and a second drain. In addition, a second gate insulating layer is disposed between the second gate and the second semiconductor stack structure for forming a second HEMT. The first gate is connected to the second source and the first source is connected to the second drain. The passivation film covers the first HEMT and the second HEMT, and includes a plurality of openings corresponding to the first drain, the second gate, and the second source, respectively.

BRIEF DESCRIPTION OF THE DRAWINGS

FIGS. 4A to 4F show process steps according to the first embodiment of the present invention;

FIG. 5A shows a top view of the group-III nitride semiconductor device according to the second embodiment of the present invention;

FIGS. 6A to 6E show process steps according to the second embodiment of the present invention;

FIGS. 8A to 8F show process steps according to the third embodiment of the present invention.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
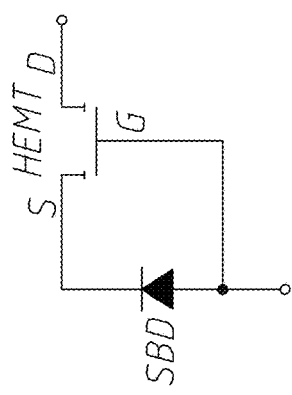
FIG. 1 shows a schematic diagram of the prior art.
Figure 2:
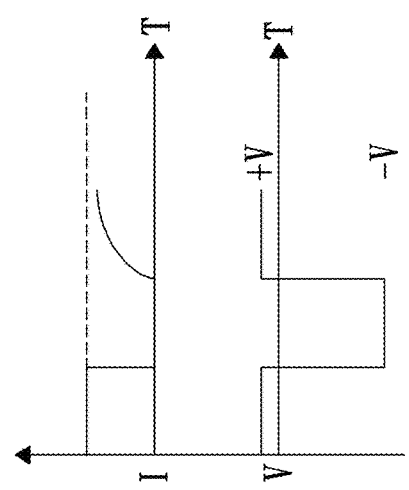
FIG. 2 shows a schematic diagram of forward recovery current.
Figure 3A:
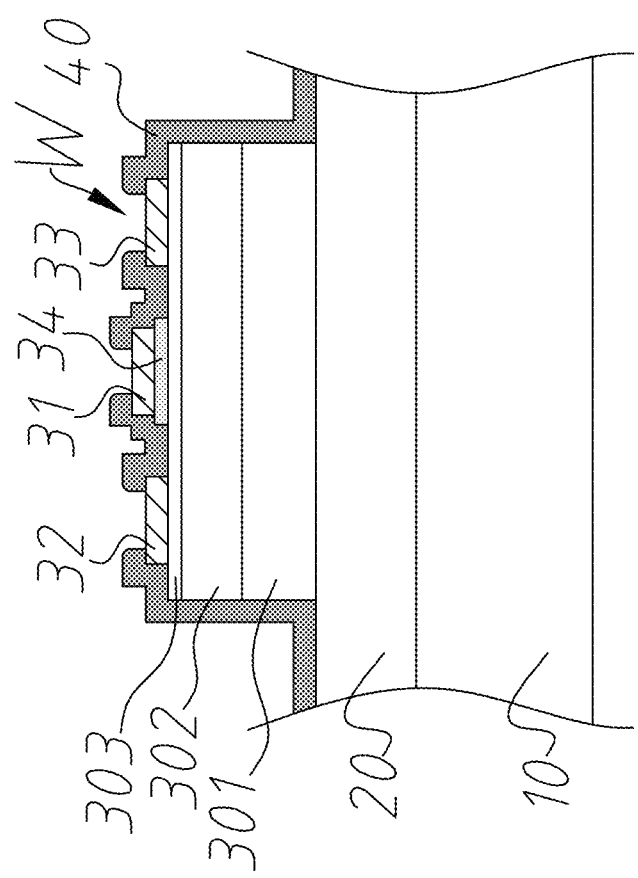
FIG. 3A shows a schematic diagram of the group-III nitride semiconductor device according to the first embodiment of the present invention.

Please refer to FIG. 3A, which shows a schematic diagram of the group-III nitride semiconductor device according to the first embodiment of the present invention. As shown in the figure, the group-III nitride semiconductor device comprises a substrate 10, a buffer layer 20, a semiconductor stack structure 30, and a passivation film 40. The buffer layer 20 is disposed on the substrate 10. The semiconductor stack structure 30 is disposed on the buffer layer 20 and comprises a plurality of electrodes, including a gate 31, a source 32, and a drain 33. In addition, a gate insulating layer 34 is disposed between the gate 31 and the semiconductor stack structure 30 for forming a HEMT. Besides, the passivation film 40 covers the HEMT and includes a plurality of openings W corresponding to the gate 31, the source 32, and the drain 33, respectively.

The material of the substrate 10 is silicon; the material of the buffer layer 20 is gallium nitride; the materials of the semiconductor stack structure 30 are stacked gallium nitride and gallium aluminum nitride. The semiconductor stack structure 30 comprises a channel layer 301, a barrier layer 302, and a cover layer 303. Moreover, the present invention is not limited to the above materials.

The material of the passivation film 40, which covers the HEMT, is silicon oxynitride, which has a refractive index between 1.46 and 1.98. By using oxynitride as the material of the passivation film 40, the deep traps at the interface between the passivation film 40 and the gallium aluminum nitride is reduced effectively and thus suppressing the surface leakage current as well as avoiding accumulation of excess charges that might lead to electrode burnout. In addition, trade-off should be made between the surface leakage current and the rate of current recovery. According to the lattice structure and the deep traps according to the present invention, the optimum refractive index of the oxynitride is between 1.46 and 1.98 with the optimum thickness greater than 100 nm. In addition to suppressing the surface leakage current, the device reliability is also increased under high-speed operations.

Figure 3B:
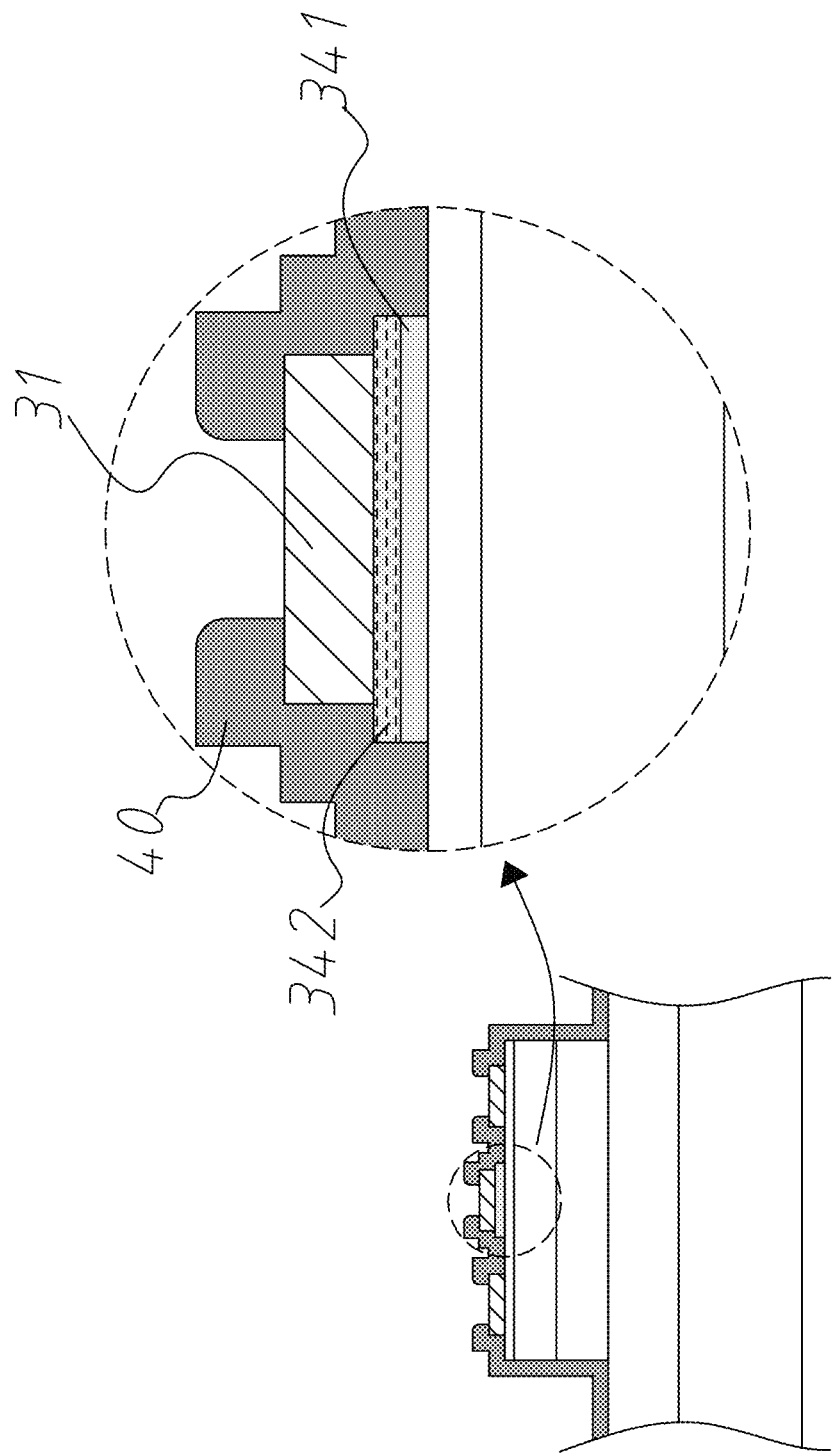
FIG. 3B shows a partially enlarged diagram of the group-III nitride semiconductor device according to the first embodiment of the present invention.
Figure 4B:
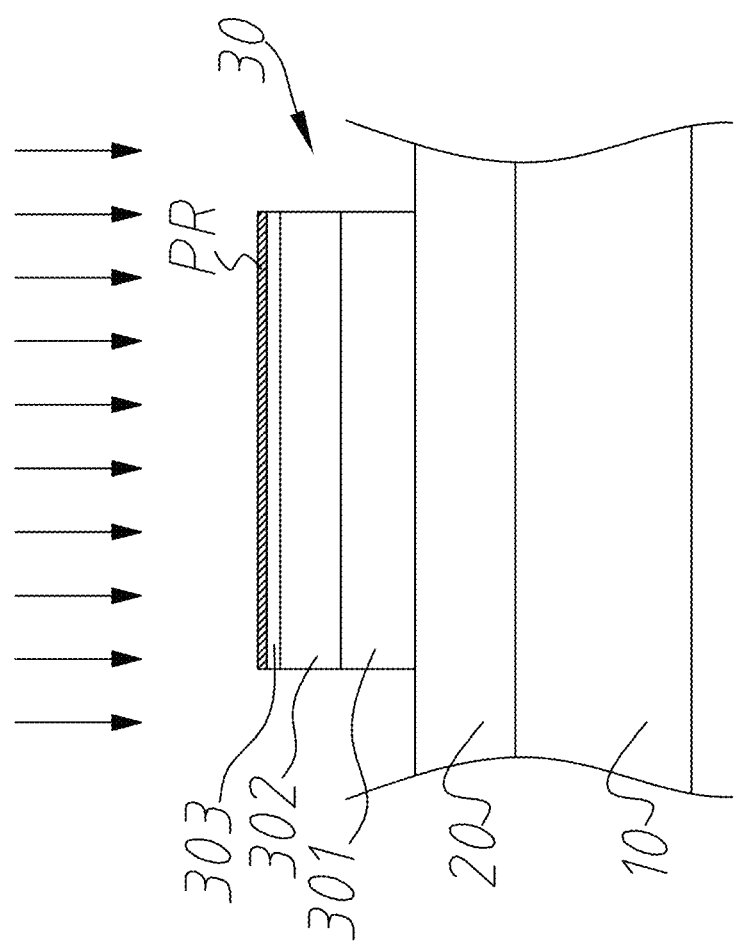
Figure 4C:
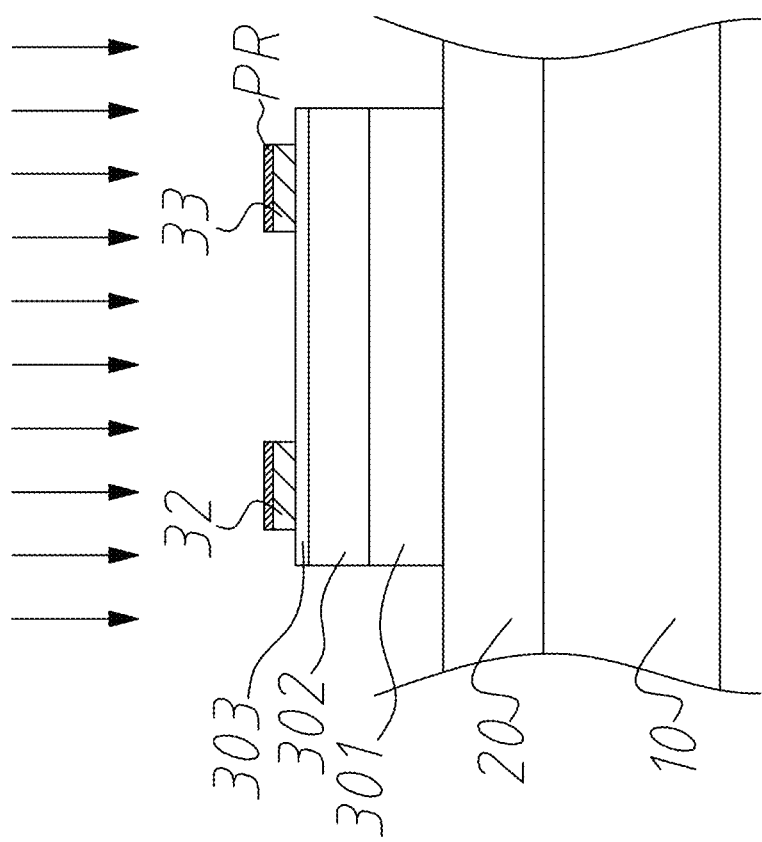
Figure 4D:
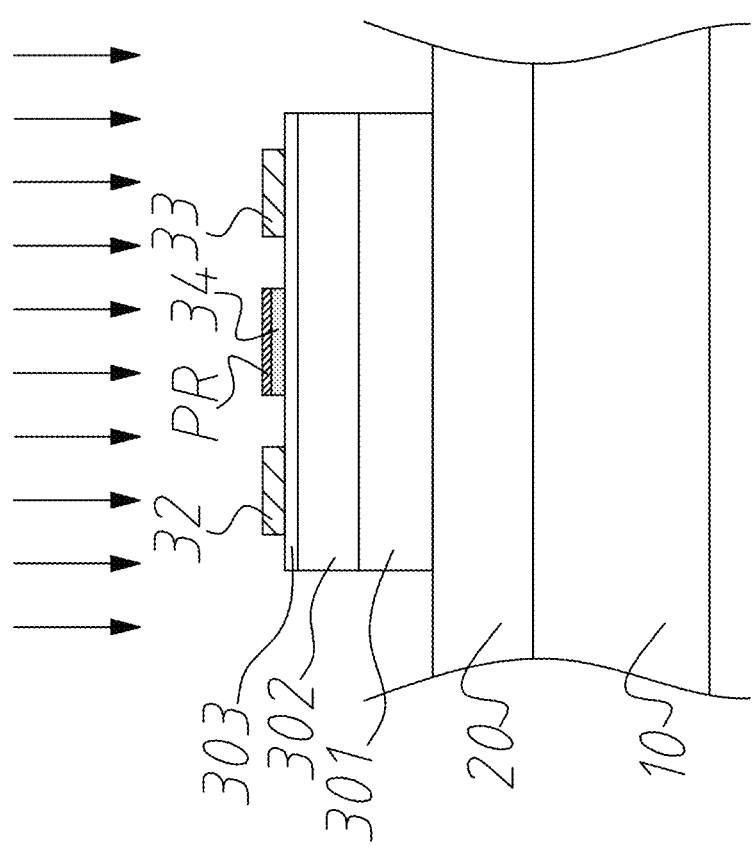
Figure 4F:
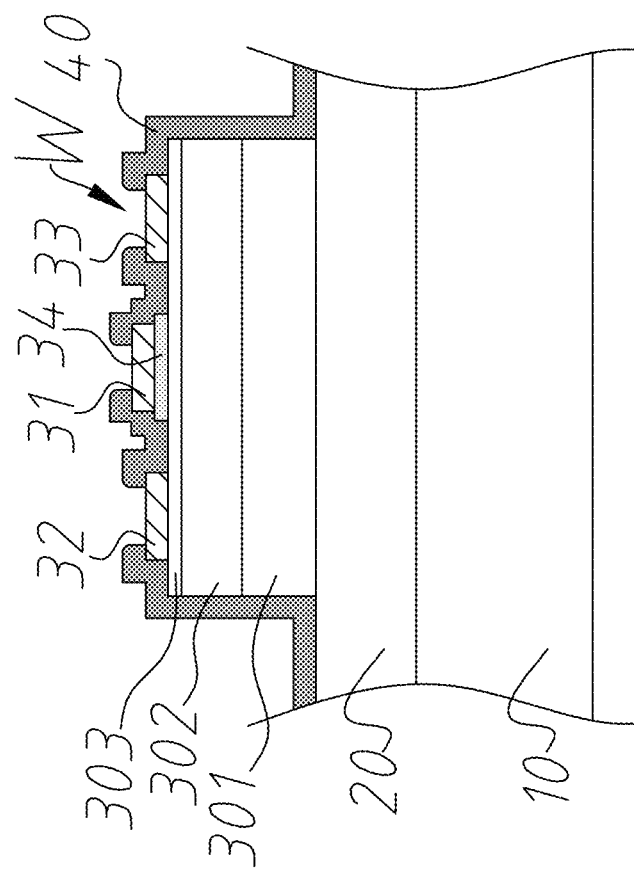

There exists a parasitic SBD between the gate 31 and the source 32. If this parasitic SBD is turned on, a negative current is very possibly generated. Thereby, according to the present invention, the gate insulating layer 34 is disposed for preventing the negative current due to turning on of the parasitic SBD between the gate 31 and the source 32. In addition, in selecting the material of the gate insulating layer 34, the current collapse effect caused by charge accumulation at the defects under the gate 31 should be considered. Thereby, like the passivation film 40 as described above, oxynitride with a refractive index between 1.46 and 1.98 is selected as the material of the gate insulating layer 34. Alternatively, the voltage endurance can be considered. Please refer to FIG. 3B, which shows a partially enlarged diagram of the first embodiment. Silicon oxynitride combined with silicon oxide can be adopted. The gate insulating layer 34 includes a bottom part 341 and a top part 342. The bottom part 341 is silicon oxynitride. The top part 342 is silicon oxide. Besides, the length of the gate insulating layer 34 must be greater than that of the gate 31 for preventing effectively the current collapse effect.

Please refer to FIGS. 4A to 4F, which show process steps for the group-III nitride semiconductor device according to the first embodiment of the present invention. As shown in the figures, the steps comprises etching a stack structure 3 on a substrate 10 with a depth between 250 nm and 1000 nm and forming a semiconductor stack structure 30; performing a first surface oxidation process; coating an ohmic metal layer, removing the ohmic metal layer, and forming a source 32 and a drain 33; performing a second surface oxidation process; coating an insulating layer, etching the insulating layer, and forming a gate insulating layer 34 between the source 32 and the drain 33; coating a Schottky metal layer, removing the Schottky metal layer, and forming a gate 31 on the gate insulating layer 34; coating a passivation film 40, etching the passivation film 40, and forming a plurality of openings W on the passivation film 40 with the locations of the openings W corresponding to the gate 31, the source 32, and the drain 33, respectively.

In the fabrication process, considering the materials of the passivation film 40 and the gate insulating layer 34 are both silicon oxynitride, while etching the stack structure 3, the depth is between 250 nm and 1000 nm. This is because while etching the stack structure 3, if the etching depth is deeper, more stress will be released by gallium nitride and gallium aluminum nitride. Then channel velocity changes and the reverse leakage current are increased accordingly. Besides, if the refractive index of the passivation film 40 is adjusted, the surface stress of the device is influenced as well. Thereby, when the passivation film 40 is silicon oxynitride and the refractive index is between 1.46 and 1.98, the optimum etching depth is between 250 nm and 1000 nm.

In order to avoid dangling bonds or defects on the surface of the cover layer from forming paths for leakage current, according to the present invention, a surface oxidation process is used for patching the surface. The surface oxidation process is a high-temperature oxidation with temperatures between 400 and 800° C. Alternatively, a plasma oxidation method can be adopted. In the second surface oxidation process of the process flow, the surface oxide can be first kept. It can be removed while forming the gate insulating layer 34 in later steps.

In addition to the above technical features, the group-III nitride semiconductor device according to the present invention can be formed along with the devices according to other embodiments of the present invention in the same process steps and on the same substrate. The other embodiments will be described later.

In addition, if the HEMT according to the present embodiment is an enhancement-mode HEMT, only one step is added for injecting fluorine ions. Injection of fluorine ions can be performed using an inductively coupled plasma (ICP) process.

Figure 5B:
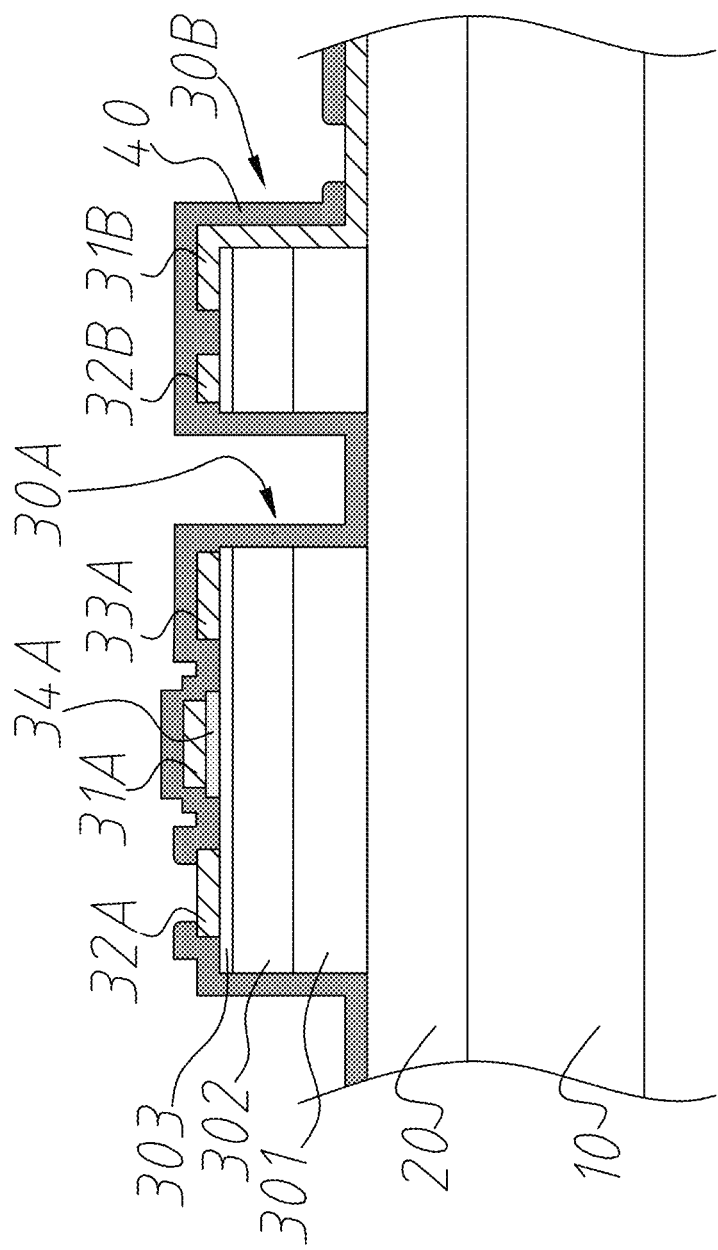
FIG. 5B shows a cross-sectional view along the line segment V-V' in FIG. 5A.

Please refer to FIGS. 5A and 5B. FIG. 5A shows a top view of the group-III nitride semiconductor device according to the second embodiment of the present invention; FIG. 5B shows a cross-sectional view along the line segment V-V' in FIG. 5A. As shown in the figures, the group-III nitride semiconductor device according to the present invention comprises a substrate 10, a buffer layer 20, a first semiconductor stack structure 30A, a second semiconductor stack structure 30B, and a passivation film 40. The buffer layer 20 is disposed on the substrate 10. The first semiconductor stack structure 30A and the second semiconductor stack structure 30B are disposed on the buffer layer 20. The first semiconductor stack structure 30A comprises a plurality of electrodes, including a gate 31A, a source 32A, and a drain 33A. In addition, a gate insulating layer 34A is disposed between the gate 31A and the first semiconductor stack structure 30A for forming a HEMT using the first semiconductor stack structure 30A and the plurality of electrodes. The second semiconductor stack structure 30B comprises an anode 31B and a cathode 32B for forming a SBD. The anode 31B is connected to the gate 31A and the cathode 32B is connected to the drain 33A. In addition, the passivation film 40 covers the HEMT and the SBD, and includes a plurality of openings W corresponding to the source 32A and the anode 31B, respectively.

The materials of the first semiconductor stack structure 30A and the second semiconductor stack structure 30B are stacked gallium nitride and gallium aluminum nitride. The first semiconductor stack structure 30A and the second semiconductor stack structure 30B comprise a channel layer 301, a barrier layer 302, and a cover layer 303, respectively. Moreover, the present invention is not limited to the above materials.

The material of the passivation film 40 is silicon oxynitride with a refractive index between 1.46 and 1.98 and a thickness greater than 100 nm. By using the material of the passivation film 40, the surface leakage current of the device is reduced and the forward recovery current thereof is accelerated. This has been described above. The locations of the openings W of the passivation film 40 correspond to the source 32A and the anode 31B, respectively, for connection of the device to external circuits.

Figure 5C:
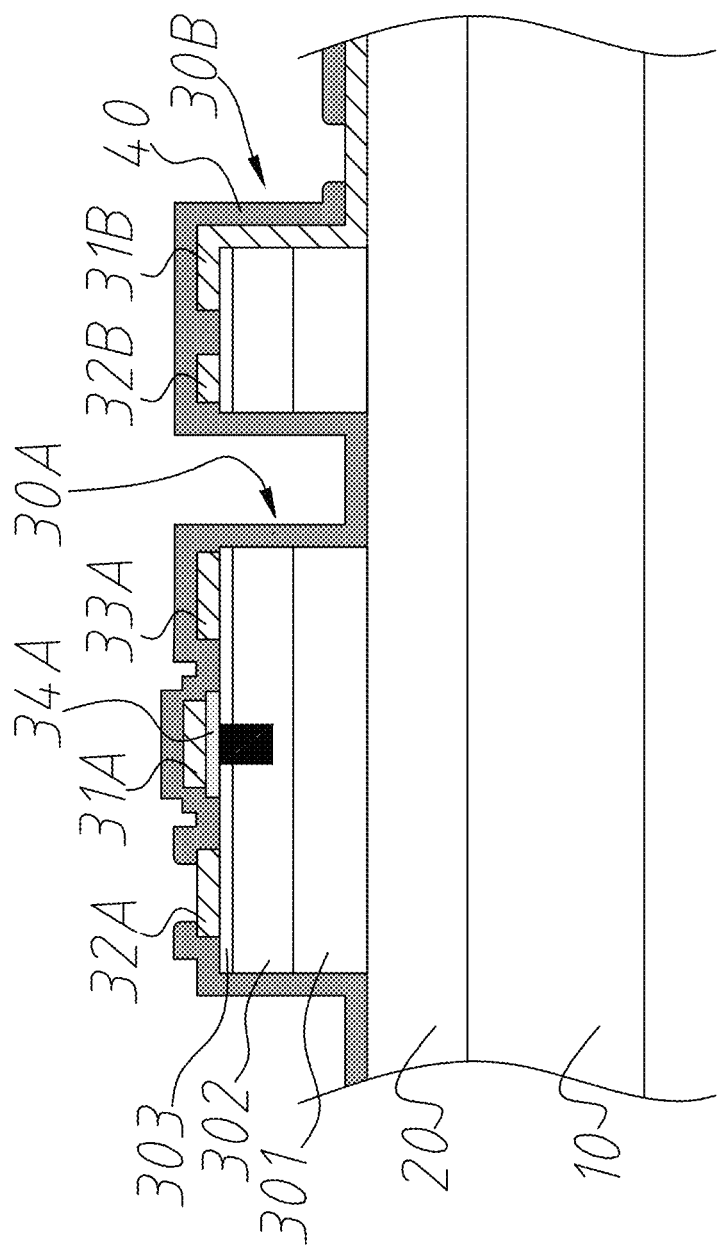
FIG. 5C shows a cross-sectional view along the line segment V-V' in FIG. 5A according to another embodiment.
Figure 5D:
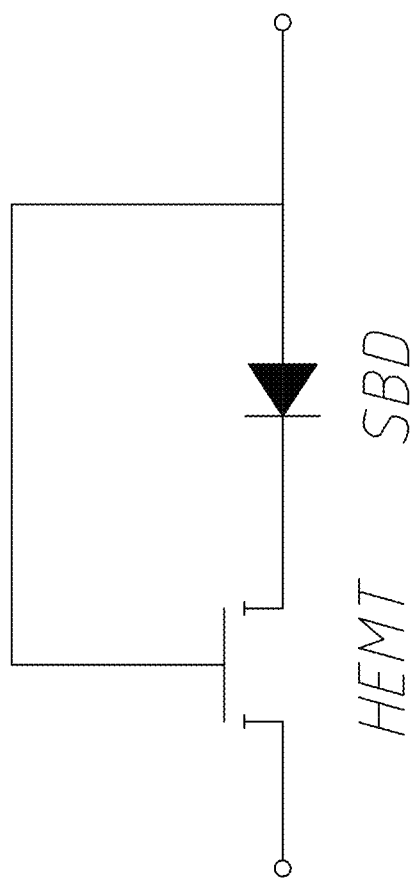
FIG. 5D shows the equivalent circuit of the group-III nitride semiconductor device according to the second embodiment of the present invention.
Figure 6A:
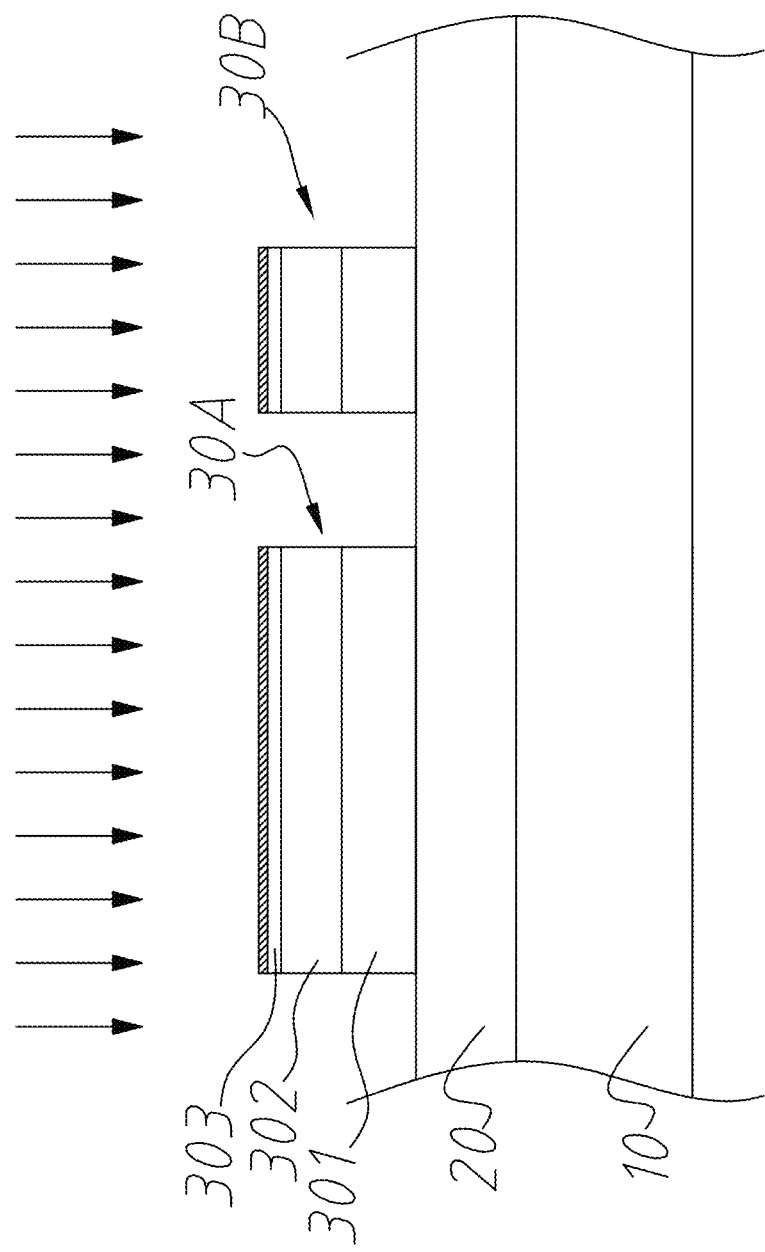
Figure 6D:
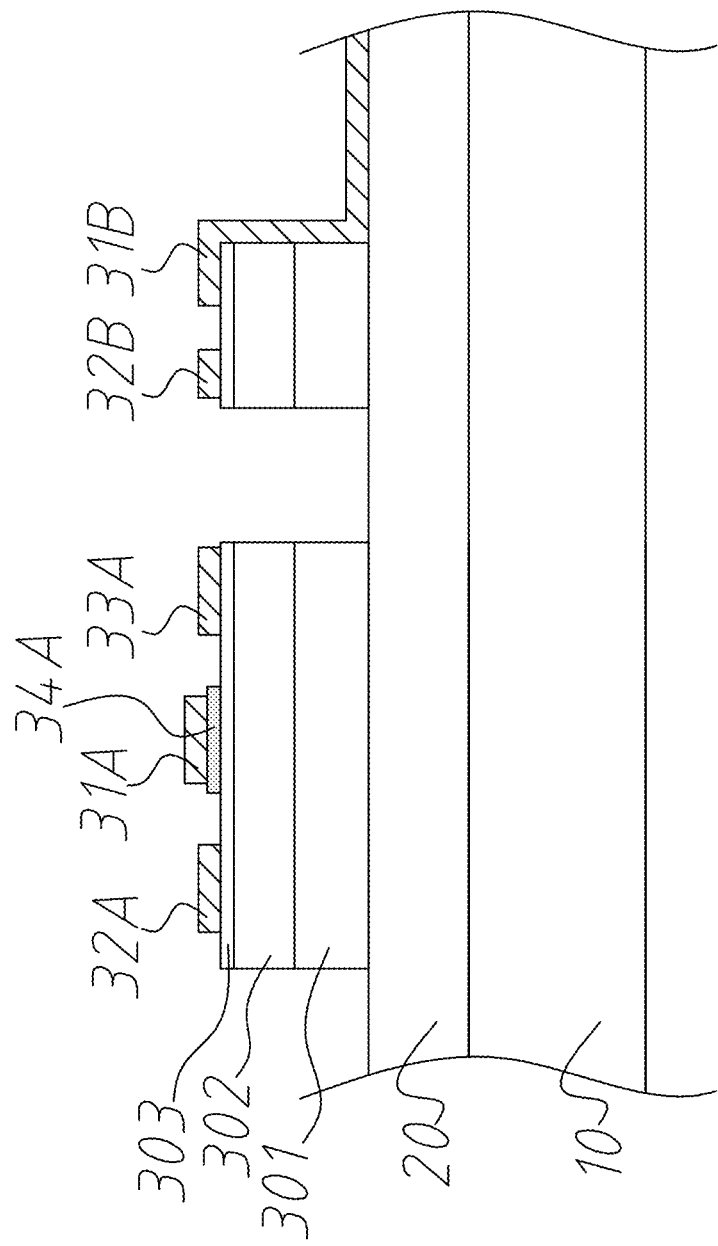

The group-III nitride semiconductor device according to the second embodiment of the present invention includes the depletion-mode HEMT and the SBD. By using the HEMT to protect the SBD, the reverse breakdown voltage of the device is increased. In addition, thanks to the protection by the passivation film 40, the surface leakage current can be suppressed effectively and thus allowing the device to operate in high speed. Moreover, the HEMT can further be an enhancement-mode HEMT, as shown in FIG. 5C. By using the characteristic that an enhancement-mode HEMT requires a high turn-on voltage, the purpose of circuit protection can be achieved.

Please refer to FIGS. 6A to 6E, which show process steps according to the second embodiment of the present invention. As shown in the figures, the steps comprises etching a stack structure 3 (not shown in the figures) on a substrate 10 with a depth between 250 nm and 1000 nm and forming a first semiconductor stack structure 30A and a second semiconductor stack structure 30B; performing a first surface oxidation process; coating an ohmic metal layer, removing the ohmic metal layer, forming a source 32A and a drain 33A on the first semiconductor stack structure 30A, forming a cathode 32B connected to the drain 33A on the second semiconductor stack structure 30B; performing a second surface oxidation process; coating an insulating layer, etching the insulating layer, and forming a gate insulating layer 34A between the source 32A and the drain 33A; coating a Schottky metal layer, removing the Schottky metal layer, forming a gate 31A on the gate insulating layer 34A, and forming an anode 31B connected to the gate 31A on the second semiconductor stack structure 30B; coating a passivation film 40, etching the passivation film 40, and forming a plurality of openings W on the passivation film 40 with the locations of the openings W corresponding to the source 32A and the anode 31B, respectively.

The parameters and conditions of the second embodiment according to the present invention are identical to those of the first embodiment. Hence, the details will not be described again. According to the fabrication process of the second embodiment, the process can be performed in the same process of the first embodiment. Consequently, substantial time and costs can be saved.

In addition, if the HEMT according to the present embodiment is an enhancement-mode HEMT, only one step is added, which is injecting fluorine ions into the barrier layer. Injection of fluorine ions can be performed using an ICP process or Ion Implantation.

Figure 7A:
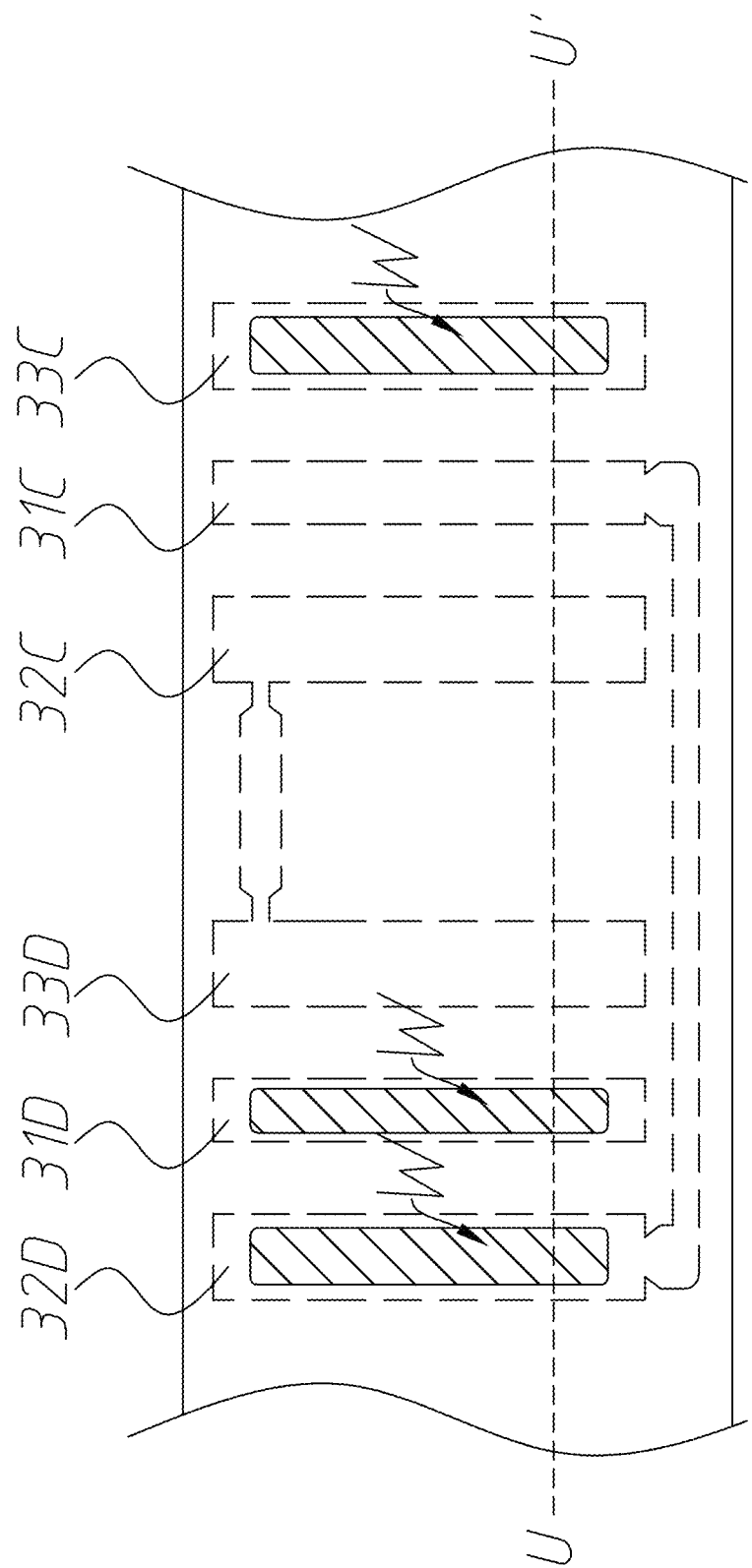
FIG. 7A shows a top view of the group-III nitride semiconductor device according to the third embodiment of the present invention.
Figure 7B:
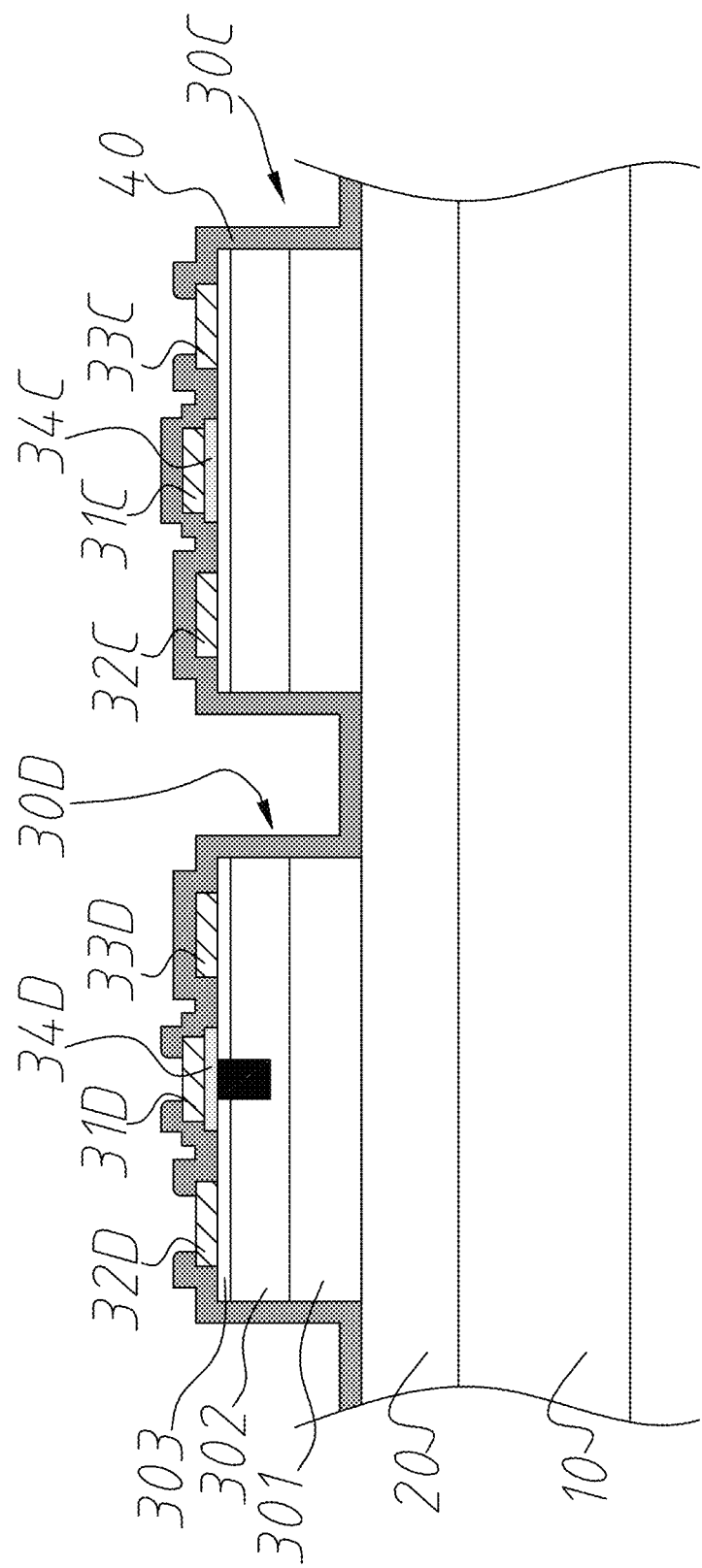
FIG. 7B shows a cross-sectional view along the line segment U-U' in FIG. 7A.
Figure 7C:
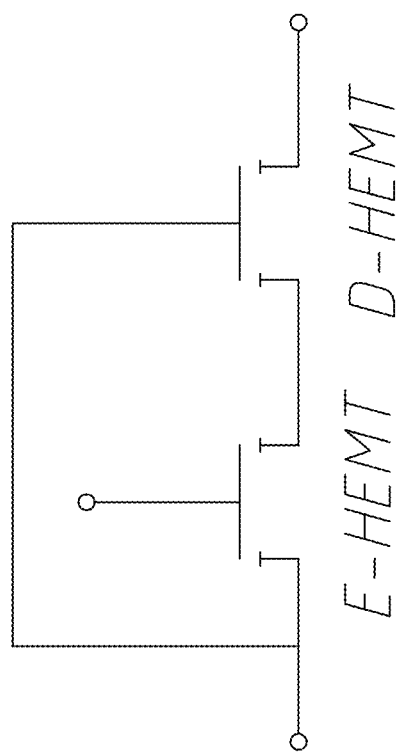
FIG. 7C shows the equivalent circuit of the group-III nitride semiconductor device according to the third embodiment of the present invention.
Figure 8A:
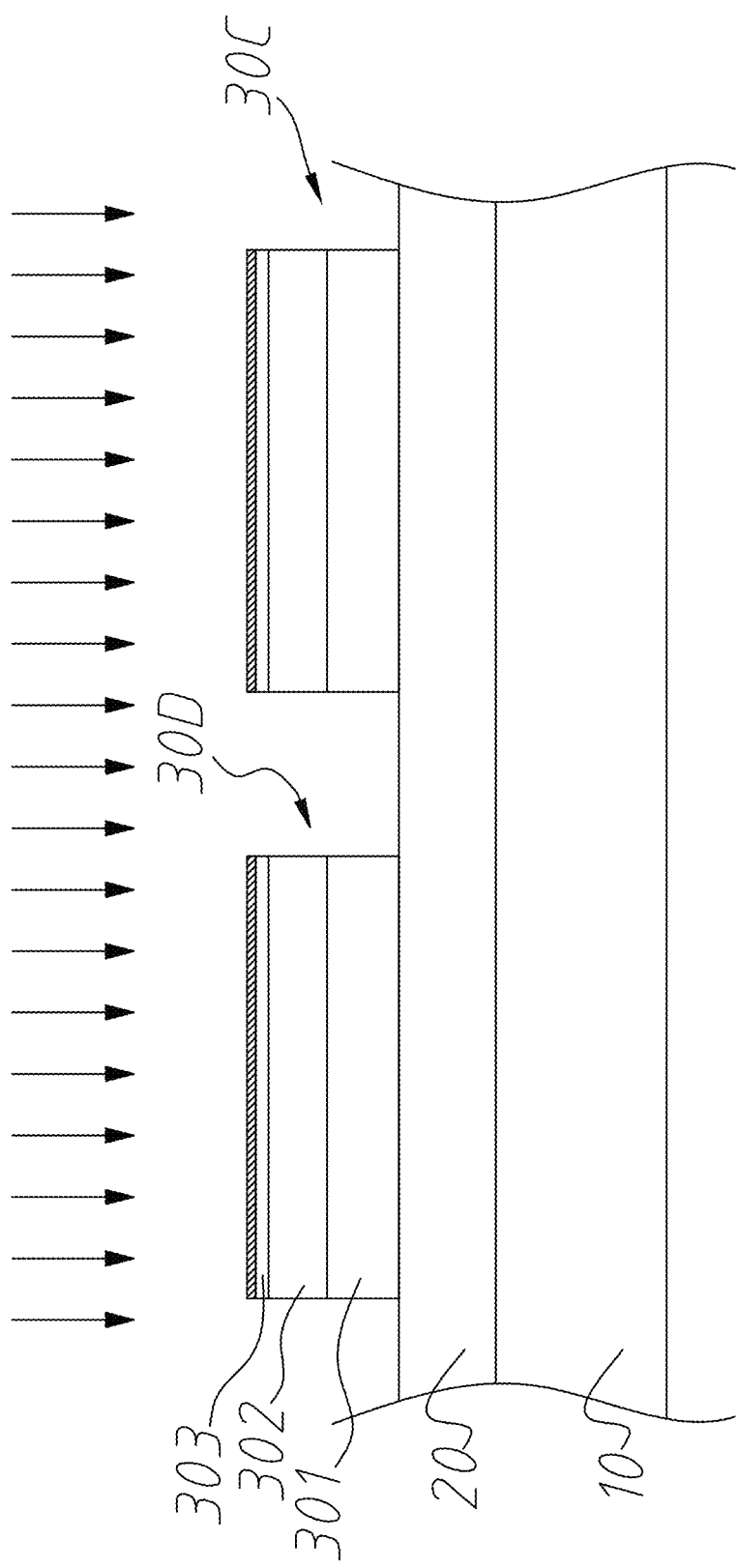
Figure 8B:
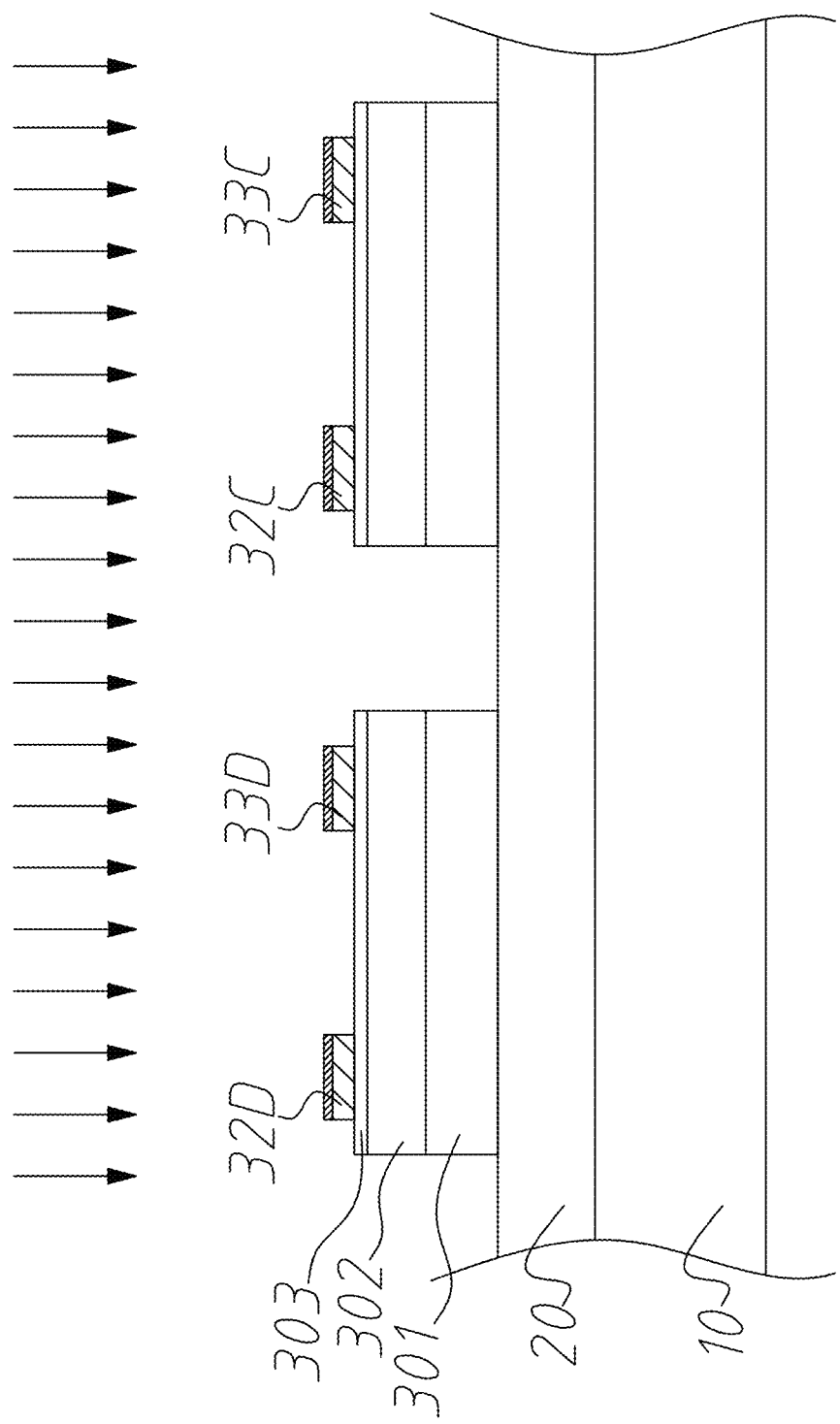
Figure 8C:
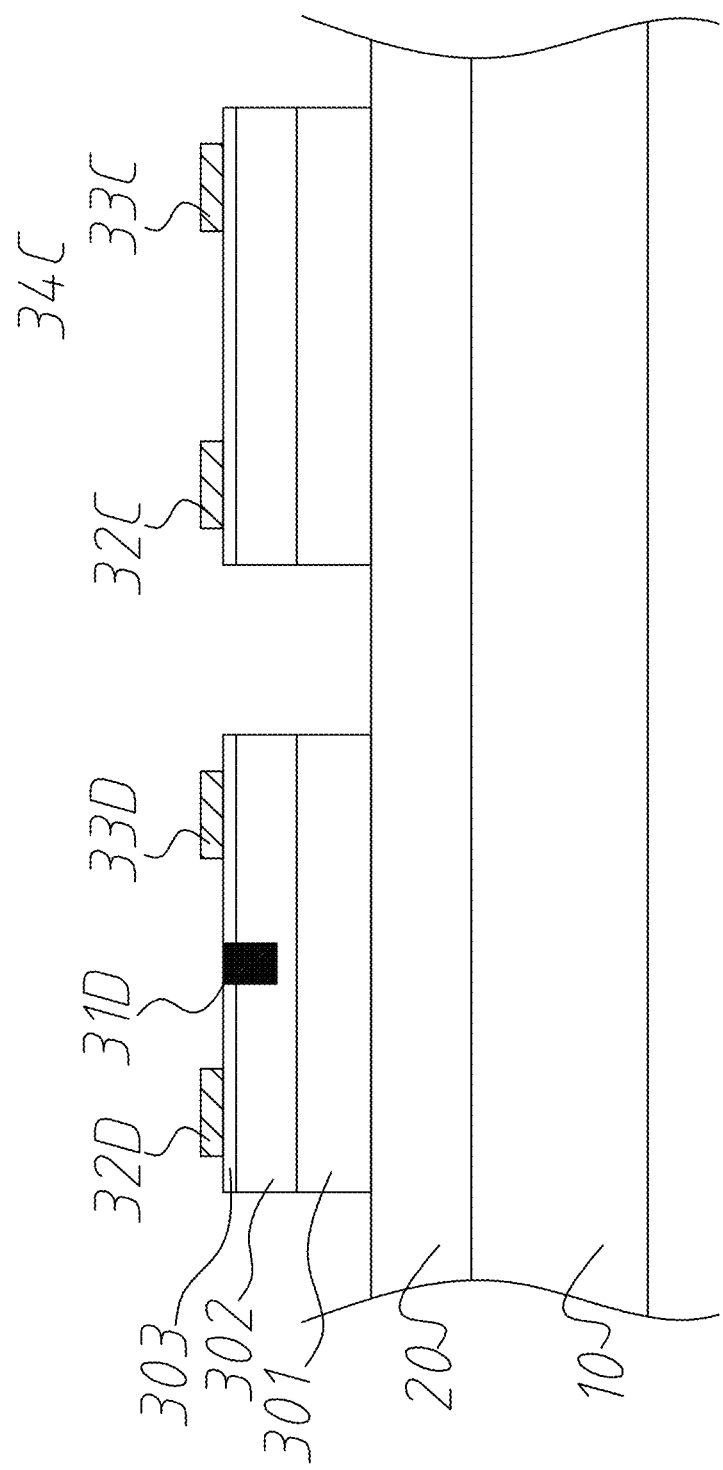
Figure 8F:
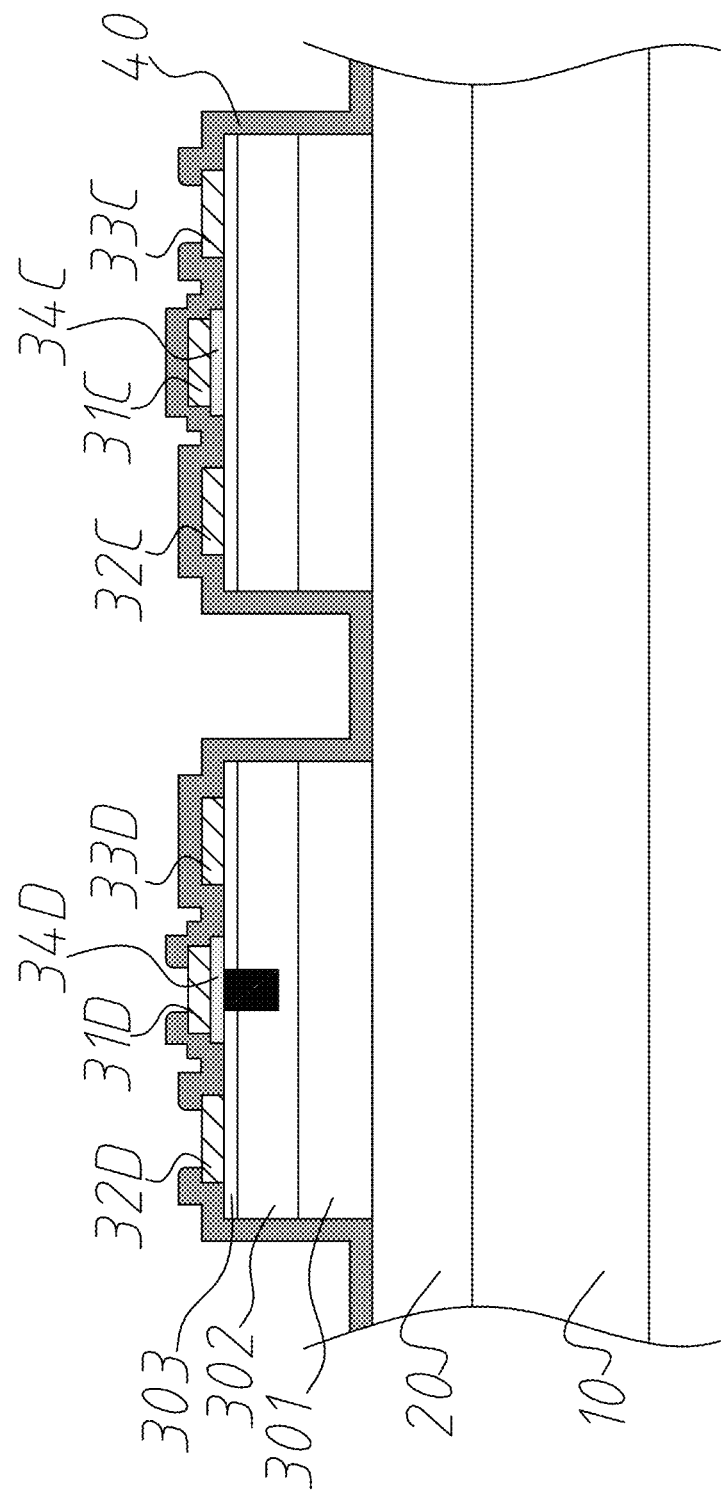

Please refer to FIGS. 7A and 7B. FIG. 7A shows a top view of the group-III nitride semiconductor device according to the third embodiment of the present invention; FIG. 7B shows a cross-sectional view along the line segment U-U' in FIG. 7A. As shown in the figures, the group-III nitride semiconductor device according to the present embodiment comprises a substrate 10, a buffer layer 20, a first semiconductor stack structure 30C, a second semiconductor stack structure 30D, and a passivation film 40. The buffer layer 20 is disposed on the substrate 10. The first semiconductor stack structure 30C is disposed on the buffer layer 20 and comprises a plurality of electrodes, including a first gate 31C, a first source 32C, and a first drain 33C. In addition, a first gate insulating layer 34C is disposed between the first gate 31C and the first semiconductor stack structure 30C for forming a first HEMT. The second semiconductor stack structure 30D comprises a plurality of electrodes, including a second gate 31D, a second source 32D, and a second drain 33D. In addition, a second gate insulating layer 34D is disposed between the second gate 31D and the second semiconductor stack structure 30D for forming a second HEMT. The first gate 31C is connected to the second source 32D and the first source 32C is connected to the second drain 33D. Furthermore, the passivation film 40 covers the first HEMT and the second HEMT, and includes a plurality of openings W corresponding to the first drain 33C, the second gate 31D, and the second source 32D, respectively.

The materials of the first semiconductor stack structure 30C and the second semiconductor stack structure 30D are stacked gallium nitride and gallium aluminum nitride. The first semiconductor stack structure 30C and the second semiconductor stack structure 30D comprise a channel layer 301, a barrier layer 302, and a cover layer 303, respectively. Moreover, the present invention is not limited to the above materials.

The material of the passivation film 40 is silicon oxynitride with a refractive index between 1.46 and 1.98 and a thickness greater than 100 nm. By using the material of the passivation film 40, the surface leakage current of the device is reduced and the forward recovery current thereof is accelerated. This has been described above. The locations of the openings W of the passivation film 40 correspond to the first drain 33C, the second gate 31D, and the second source 32D, respectively, for connection of the device to external circuits.

The group-III nitride semiconductor device according to the third embodiment of the present invention can be a mixed mode device. That is to say, one of the first and second HEMTs is a depletion-mode HEMT and the other is an enhancement-mode HEMT. By coupling HEMTs of different modes, the reverse breakdown voltage of the device can be increased. Besides, with the protection of the passivation film 40, the surface leakage current can be suppressed effectively. Furthermore, when the present invention is applied in the mixed mode, the depletion-mode HEMT is a normally-on device. It requires a sufficient negative voltage at the gate to be turned off. On the contrary, the enhancement-mode HEMT requires a positive voltage for operation. When it operates, there is a channel resistance. Thereby, a sufficient positive voltage applied to the enhancement-mode HEMT can turn on the depletion-mode HEMT as well. In addition, according to experiments, when the gate widths of two HEMTs are identical, the current in an enhancement-mode HEMT will be higher than that in a depletion-mode HEMT. Thereby, while fabricating the device according to the present invention, the gate width of the depletion-mode HEMT should be made wider than that of the enhancement-mode one. Otherwise, the current will be limited by the depletion-mode HEMT. According to experiments, when the ratio of the width of the enhancement-mode HEMT to that of the depletion-mode one is 1:3, ideal operating currents will be given.

Please refer to FIGS. 8A to 8F, which show process steps according to the third embodiment of the present invention. As shown in the figures, the steps comprises etching a stack structure 3 (not shown in the figures) on a substrate 10 with a depth between 250 nm and 1000 nm and forming a first semiconductor stack structure 30C and a second semiconductor stack structure 30D; performing a first surface oxidation process; coating an ohmic metal layer, removing the ohmic metal layer, forming a first source 32C and a first drain 33C on the first semiconductor stack structure 30C, forming a second source 32D and a second drain 33D on the second semiconductor stack structure 30D, and the first source 32C connected to the second drain 33D; defining fluorine-ion injection regions on the second semiconductor stack structure 30D, and injecting fluorine ions into the barrier layer; performing thermal treatment for fluorine ions and a second surface oxidation process; coating an insulating layer, etching the insulating layer, forming a first gate insulating layer 34C between the first source 32C and the first drain 33C, and forming a second gate insulating layer 34D between the second source 32D and the second drain 33D to prevent Schottky metal direct contact to 30D which will create a Schottky diode between the second gate 31D and the second source 32D, when a voltage is given, the Schottky diode between the second gate 31D and the second source 32D will turn on; coating a Schottky metal layer, removing the Schottky metal layer, forming a first gate 31C on the first gate insulating layer 34C, forming a second gate 31D on the second gate insulating layer 34D, and the first gate 31C connected to the second source 32D; coating a passivation film 40, etching the passivation film 40, and forming a plurality of openings W on the passivation film 40 with the locations of the openings W corresponding to the first drain 33C, the second gate 31D, and the second source 32D, respectively.

The parameters and conditions of the third embodiment according to the present invention are identical to those of the first embodiment. Hence, the details will not be described again. According to the fabrication process of the third embodiment, the process can be performed in the same processes of the first and second embodiments. Consequently, substantial time and costs can be saved.

Figure 9:
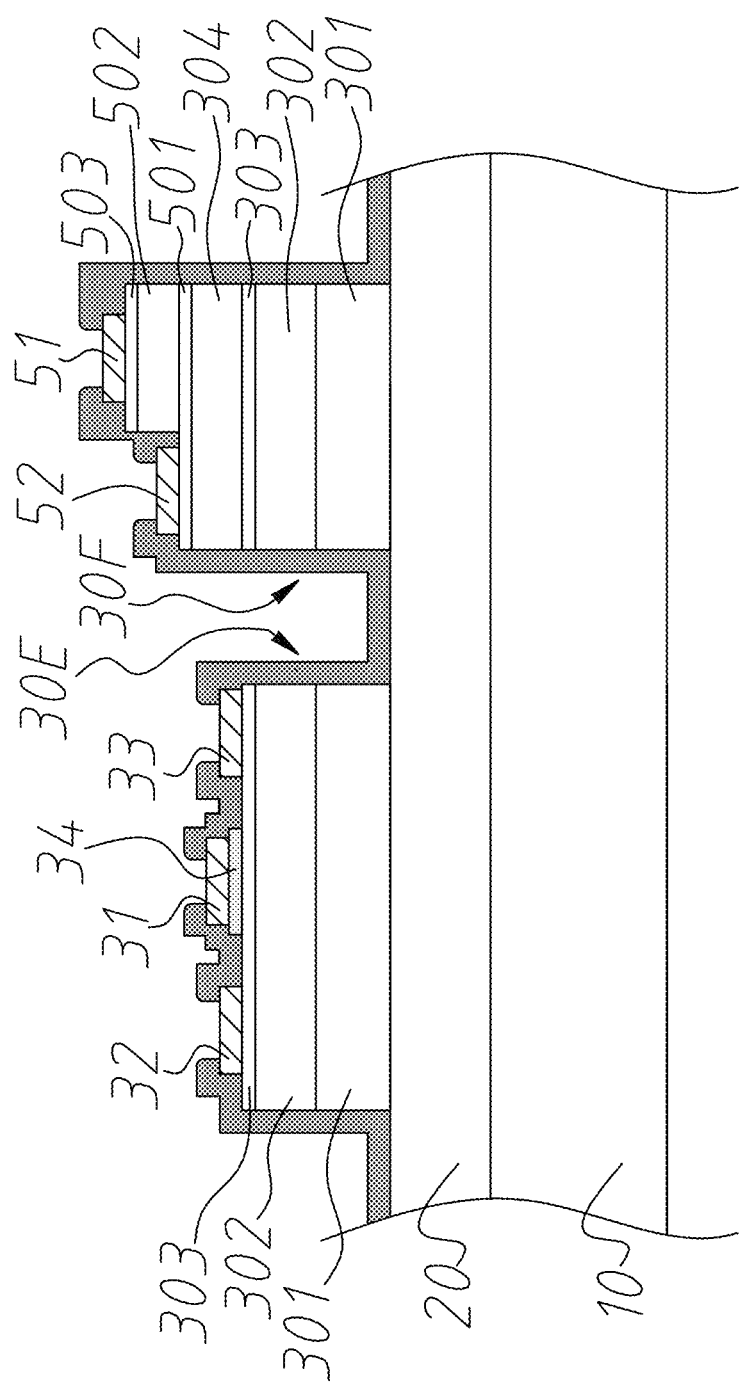
FIG. 9 shows a schematic diagram of the group-III nitride semiconductor device according to the fourth embodiment of the present invention.

Please refer to FIG. 9, which shows a schematic diagram of the group-III nitride semiconductor device according to the fourth embodiment of the present invention. As shown in the figure, the group-III nitride semiconductor device according to the present invention can combine a protection diode in the previous embodiments. For example, according to the first embodiment, the group-III nitride semiconductor device further comprises a second semiconductor stack structure 30F, a second buffer layer 304, an n-type doping layer 501, an intrinsic layer 502, a p-type doping layer 503, a positive electrode 51, and a negative electrode 52. The n-type doping layer 501, the intrinsic layer 502, and the p-type doping layer form a PIN diode, which can be used for protecting HEMT or SBD.

Although the reverse breakdown voltage of a PIN diode is lower than that of a HEMT, a PIN diode owns the recoverable property. This property enables a PIN diode to continue operating after breakdown. Contrarily, a HEMT is unrecoverable after breakdown. By using this property in circuit designs, PIN diodes can act as protection devices that reach breakdown first at reverse biases and thus protecting HEMTs.

The fabrication of protection diodes can be combined with the processes according to the previous embodiments. For example, in the process according to the first embodiment, while etching the stack structure 3, a second semiconductor stack structure 30F can be formed concurrently. A protection diode is then formed on the second semiconductor stack structure 30F. While removing the ohmic metal layer, a negative electrode 52 is formed on the protection diode. While etching the Schottky metal layer, a positive electrode 51 is formed on the protection diode. Accordingly, in a single process flow, a protection diode can be fabricated. This helps saving time and costs.

The group-III nitride semiconductor device according to the present invention includes a HEMT, which includes a passivation film covering thereon. The material of the passivation film 40 is silicon oxynitride with a refractive index between 1.46 and 1.98. By using oxynitride as the material of the passivation film, the deep traps at the interface between the passivation film and the gallium aluminum nitride is reduced effectively and thus suppressing the surface leakage current as well as avoiding accumulation of excess charges that might lead to electrode burnout. In addition, the rate of forward current recovery is accelerated, so that the device reliability is increased under high-speed operations. The material of the gate insulating layer of the HEMT is also silicon oxynitride with a refractive index between 1.46 and 1.98. According to the second embodiment, a SBD is further included for increasing the reverse breakdown voltage of the device. According to the third embodiment, HEMTs of different modes are included for achieving the efficacy of increasing reverse breakdown voltage. According to the fourth embodiment, a protection diode is further includes for protecting the device from occurring unrecoverable condition caused by reverse breakdown. In addition, the process according to each embodiment can be completed on a single substrate concurrently. This helps saving substantial time and costs.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

What is claimed is:

1. A group-III nitride semiconductor device, comprising:
a substrate;
a buffer layer, disposed on said substrate;
a first semiconductor stack structure comprising group-III nitride semiconductors disposed on said buffer layer, comprising a gate, a source, and a drain, a gate insulating layer disposed between said gate and said first semiconductor stack structure for forming a high electron mobility transistor;
a second semiconductor stack structure comprising group-III nitride semiconductors, disposed on said buffer layer and comprising an anode and a cathode for forming a Schottky barrier diode;
a passivation film, made of silicon oxynitride, covering said high electron mobility transistor and said Schottky barrier diode, and including a plurality of openings corresponding to said source and said anode, respectively; and,
each of said first and second semiconductor stack structures including a cover layer having an oxidized surface sandwiched between a barrier layer of said first semiconductor stack structure and said source and said drain of said first semiconductor stack structure, and between said barrier layer of said second semiconductor stack structure and said anode and said cathode of said second semiconductor stack structure;
wherein said anode connected to said gate and said cathode connected to said drain under said covering of said passivation film, said first and second semiconductor stack structures are disposed on said buffer layer separately.

2. The semiconductor device of claim 1, wherein said first semiconductor stack structure and said second semiconductor stack structure, respectively, comprise:
a channel layer, disposed on said buffer layer;
said barrier layer, disposed on said channel layer; and
said cover layer, disposed on said barrier layer.

3. The semiconductor device of claim 1, wherein said first semiconductor stack structure, is an enhancement mode high electron mobility transistor by using fluorine-ion injection method.

4. The semiconductor device of claim 1, wherein said first semiconductor stack structure, is a depletion mode high electron mobility transistor.

5. A group-III nitride semiconductor device, comprising:
a substrate;
a buffer layer, disposed on said substrate;
a first semiconductor stack structure comprising group-III nitride semiconductors, disposed on said buffer layer, comprising a first gate, a first source, and a first drain, a first gate insulating layer disposed between said first gate and said first semiconductor stack structure for forming a first high electron mobility transistor;
a second semiconductor stack structure comprising group-III nitride semiconductors, disposed on said buffer layer, comprising a second gate, a second source, and a second drain, a second gate insulating layer disposed between said second gate and said second semiconductor stack structure for forming a second high electron mobility transistor; and
a passivation film, made of silicon oxynitride, covering said first high electron mobility transistor and said second high electron mobility transistor, and including a plurality of openings corresponding to said first drain, said second gate, and said second source, respectively; and,
each of said first and second semiconductor stack structures including a cover layer having an oxidized surface sandwiched between a barrier layer of said first semiconductor stack structure and said first source and said first drain of said first semiconductor stack, and between said barrier layer of said second semiconductor stack structure and said second source and said second source of said second semiconductor stack structure;
wherein said first gate connected to said second source and said first source connected to said second drain under said covering of said passivation film, said first and second high electron mobility transistors are operated in different modes and disposed on said buffer layer separately.

6. The semiconductor device of claim 5, wherein said first semiconductor stack structure and said second semiconductor stack structure, respectively, comprise:
a channel layer, disposed on said buffer layer;
said barrier layer, disposed on said channel layer; and
said cover layer, disposed on said barrier layer.

7. The semiconductor device of claim 5, wherein said second semiconductor stack structure, is an enhancement mode high electron mobility transistor by using fluorine-ion injection method.

* * * * *